(12) United States Patent
Brewer

(10) Patent No.: US 11,768,626 B2
(45) Date of Patent: Sep. 26, 2023

(54) STENCIL DATA ACCESS FROM TILE MEMORY

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 17/399,817

(22) Filed: Aug. 11, 2021

(65) Prior Publication Data

US 2023/0049052 A1 Feb. 16, 2023

(51) Int. Cl.
*G06F 3/06* (2006.01)

(52) U.S. Cl.
CPC ............ *G06F 3/0656* (2013.01); *G06F 3/0604* (2013.01); *G06F 3/0613* (2013.01); *G06F 3/0659* (2013.01); *G06F 3/0683* (2013.01)

(58) Field of Classification Search
CPC ..... G06F 3/0656; G06F 3/0604; G06F 3/0613; G06F 3/0659; G06F 3/0683
See application file for complete search history.

(56) References Cited

U.S. PATENT DOCUMENTS

| | | | |
|---|---|---|---|
| 7,978,199 B2* | 7/2011 | Howson | G06T 1/60 345/543 |
| 8,122,229 B2 | 2/2012 | Wallach et al. | |
| 8,156,307 B2 | 4/2012 | Wallach et al. | |
| 8,205,066 B2 | 6/2012 | Brewer et al. | |
| 8,423,745 B1 | 4/2013 | Brewer | |
| 8,561,037 B2 | 10/2013 | Wallach et al. | |
| 9,710,384 B2 | 7/2017 | Wallach et al. | |
| 10,990,391 B2 | 4/2021 | Brewer | |
| 10,990,392 B2 | 4/2021 | Brewer | |
| 11,435,941 B1* | 9/2022 | Xu et al. | G06N 5/04 |
| 2008/0270708 A1 | 10/2008 | Warner et al. | |
| 2012/0079177 A1 | 3/2012 | Brewer et al. | |
| 2013/0332711 A1 | 12/2013 | Leidel et al. | |
| 2015/0143350 A1 | 5/2015 | Brewer | |
| 2015/0206561 A1 | 7/2015 | Brewer et al. | |
| 2019/0042214 A1 | 2/2019 | Brewer | |

(Continued)

FOREIGN PATENT DOCUMENTS

| | | |
|---|---|---|
| WO | 2010051167 A1 | 5/2010 |
| WO | 2013184380 A2 | 12/2013 |
| WO | 2019089816 A2 | 5/2019 |
| WO | 2019191740 A1 | 10/2019 |
| WO | 2019191742 A1 | 10/2019 |

(Continued)

*Primary Examiner* — Idriss N Alrobaye
*Assistant Examiner* — Richard B Franklin
(74) *Attorney, Agent, or Firm* — Schwegman Lundberg & Woessner, P.A.

(57) ABSTRACT

A reconfigurable compute fabric of a system can include multiple nodes, and each node can include multiple, communicatively coupled tiles with respective processing and storage elements. In an example, a tile-based processor can be configured to perform operations comprising receiving a first stencil that defines input data for a first operation. The stencil can have a height corresponding to N rows in a main memory and a stencil width corresponding to M columns in the main memory. The processor can perform operations comprising establishing N buffers in a tile memory, each buffer having M buffer elements, and populating the M buffer elements of the N buffers using respective information, defined by the first stencil, from the main memory. Tile-based stencil operations can use information from the N buffers and provide compute results in an output array.

20 Claims, 17 Drawing Sheets

(56) References Cited

U.S. PATENT DOCUMENTS

| | | | |
|---|---|---|---|
| 2019/0171604 A1 | 6/2019 | Brewer |
| 2019/0243700 A1 | 8/2019 | Brewer |
| 2019/0303154 A1 | 10/2019 | Brewer |
| 2019/0324928 A1 | 10/2019 | Brewer |
| 2019/0340019 A1 | 11/2019 | Brewer |
| 2019/0340020 A1 | 11/2019 | Brewer |
| 2019/0340023 A1 | 11/2019 | Brewer |
| 2019/0340024 A1 | 11/2019 | Brewer |
| 2019/0340027 A1 | 11/2019 | Brewer |
| 2019/0340035 A1 | 11/2019 | Brewer |
| 2019/0340154 A1 | 11/2019 | Brewer |
| 2019/0340155 A1 | 11/2019 | Brewer |
| 2021/0055964 A1 | 2/2021 | Brewer |
| 2021/0064374 A1 | 3/2021 | Brewer |
| 2021/0064435 A1 | 3/2021 | Brewer |
| 2021/0149600 A1 | 5/2021 | Brewer |

FOREIGN PATENT DOCUMENTS

| | | | |
|---|---|---|---|
| WO | 2019191744 A1 | 10/2019 |
| WO | 2019217287 A1 | 11/2019 |
| WO | 2019217295 A1 | 11/2019 |
| WO | 2019217324 A1 | 11/2019 |
| WO | 2019217326 A1 | 11/2019 |
| WO | 2019217329 A1 | 11/2019 |

* cited by examiner

STENCIL DATA ACCESS FROM TILE MEMORY

BACKGROUND

Various computer architectures, such as the Von Neumann architecture, conventionally use a shared memory for data, a bus for accessing the shared memory, an arithmetic unit, and a program control unit. However, moving data between processors and memory can require significant time and energy, which in turn can constrain performance and capacity of computer systems. In view of these limitations, new computing architectures and devices are desired to advance computing performance beyond the practice of transistor scaling (i.e., Moore's Law).

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
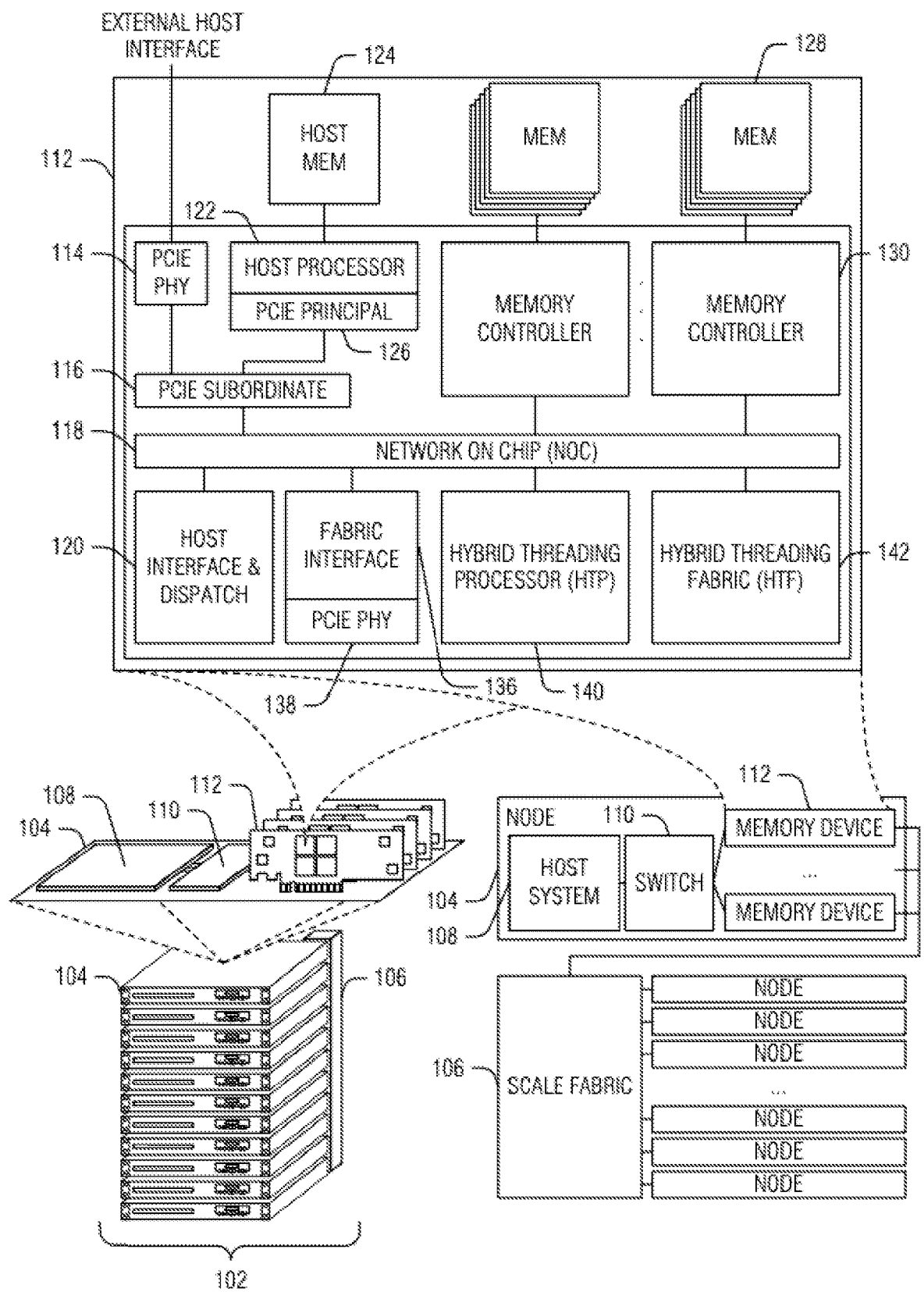
FIG. 1 illustrates generally a first example of a first memory-compute device in the context of a memory-compute system, according to an embodiment.

Recent advances in materials, devices, and integration technology, can be leveraged to provide memory-centric compute topologies. Such topologies can realize advances in compute efficiency and workload throughput, for example, for applications constrained by size, weight, or power requirements. The topologies can be used to facilitate low-latency compute near, or inside of, memory or other data storage elements. The approaches can be particularly well-suited for various compute-intensive operations with sparse lookups, such as in transform computations (e.g., fast Fourier transform computations (FFT)), or in applications such as neural networks or artificial intelligence (AI), financial analytics, or simulations or modeling such as for computational fluid dynamics (CFD), Enhanced Acoustic Simulator for Engineers (EASE), Simulation Program with Integrated Circuit Emphasis (SPICE), and others.

Systems, devices, and methods discussed herein can include or use memory-compute systems with processors, or processing capabilities, that are provided in, near, or integrated with memory or data storage components. Such systems are referred to generally herein as compute-near-memory (CNM) systems. A CNM system can be a node-based system with individual nodes in the systems coupled using a system scale fabric. Each node can include or use specialized or general purpose processors, and user-accessible accelerators, with a custom compute fabric to facilitate intensive operations, particularly in environments where high cache miss rates are expected.

In an example, each node in a CNM system can have a host processor or processors. Within each node, a dedicated hybrid threading processor can occupy a discrete endpoint of an on-chip network. The hybrid threading processor can have access to some or all of the memory in a particular node of the system, or a hybrid threading processor can have access to memories across a network of multiple nodes via the system scale fabric. The custom compute fabric, or hybrid threading fabric (HTF), at each node can have its own processor(s) or accelerator(s) or memory(ies) and can operate at higher bandwidth than the hybrid threading processor. Different nodes in a compute-near-memory system can be differently configured, such as having different compute capabilities, different types of memories, different interfaces, or other differences. However, the nodes can be commonly coupled to share data and compute resources within a defined address space.

In an example, a compute-near-memory system, or a node within the system, can be user-configured for custom operations. A user can provide instructions using a high-level programming language, such as C/C++, that can be compiled and mapped directly into a dataflow architecture of the system, or of one or more nodes in the CNM system. That is, the nodes in the system can include hardware blocks (e.g., memory controllers, atomic units, other customer accelerators, etc.) that can be configured to directly implement or support user instructions to thereby enhance system performance and reduce latency.

In an example, a compute-near-memory system can be particularly suited for implementing a hierarchy of instructions and nested loops (e.g., two, three, or more, loops deep, or multiple-dimensional loops) or other parallel or concurrent instructions. A standard compiler can be used to accept high-level language instructions and, in turn, compile directly into the dataflow architecture of one or more of the nodes. For example, a node in the system can include the HTF. The HTF can execute in a user space of the CNM system and can initiate its own threads or sub-threads, which can operate in parallel. Each thread can map to a different loop iteration to thereby support multi-dimensional loops. With the capability to initiate such nested loops, among other capabilities, the CNM system can realize significant time savings and latency improvements for compute-intensive operations.

In an example, the HTF can comprise a coarse grained reconfigurable architecture of multiple, communicatively coupled memory-compute tiles. Each tile can include compute elements or functional units, one or more memories or buffers, synchronous fabric inputs and outputs, asynchronous fabric inputs and outputs, and one or more passthrough channels for low latency communication among tiles in a node. In an example, the tiles can be configured to receive information from, or write information to, a main memory or system memory.

The present inventor has recognized, among other things, that a problem to be solved can include providing an efficient memory read mechanism for use by or in each of the tiles, or memory-compute tiles, that comprise the HTF. In an example, the problem can include performing operations for algorithms that include or use stencil data, such as using a compute element of a tile, a memory of the tile, and a main memory or tile-external memory. The present inventor has recognized that a solution to these and other problems can include or use a tile memory, such as can include a first-in first-out (FIFO) buffer, to store data received from system or main memory, and make the data available for multiple accesses, such as according to requirements of operations defined by a particular stencil. In an example, the solution can help coordinate stencil operations with fewer tile instructions, or can allow relatively larger stencil operations to be performed with relatively fewer instructions.

Stencil operations or stencil computations can include algorithms that use information from multiple different memory locations of an input grid or input array of memory, as defined by a stencil. A stencil generally includes or refers to a neighborhood of different memory locations, such as can be related or referenced together. Stated differently, a stencil can provide a map to a particular group of memory locations that can be used together, for example, as an input (or as respective different inputs) to a function or compute operation. A result of the function or compute operation can be used to populate a portion of a result array for each respective input defined by the stencil.

In some examples, a stencil can include an anchor element that serves as a reference for the group or neighborhood of other elements of the stencil. A location of the anchor element can change, such as to traverse the input array. At each different anchor element location, a corresponding different neighborhood or group of input data can be defined for the function or compute operation. An anchor element can be assigned or can be chosen from among the one or multiple other elements defined by a stencil or pattern. For example, an anchor element can be assigned or chosen to be a lower-leftmost element of a stencil, or can be assigned or chosen to be a most-central element of the stencil, or can be otherwise assigned or chosen.

In an example, a stencil can be used multiple times to process different information from an input array. Stencil operations can be useful, for example, in various computations including for imaging, simulation (e.g., fluid simulations or computational fluid dynamics), numerical methods or differential equations, neural network processing or machine learning, among other applications. Stencil operations, such as can be performed using the HTF, are discussed herein, including at FIG. 5, and at FIGS. 10-15.

In an example, the hardware connectivity of the HTF discussed herein can facilitate compilation of complicated compute kernels, such as including kernels with nested loops or kernels that include or use stencil operations. For example, tiles comprising the HTF can be connected using a reconfigurable compute fabric that helps reduce or remove constraints as to which tile-based compute resource, among multiple available resources, is selected for particular operations in a data flow. Accordingly, the HTF structure itself can help provide flexibility to the compiler. Data flows can be mapped to resources on neighboring or non-neighboring tiles using a combination of the different inputs, outputs, and passthrough channels of multiple tiles. In other words, due at least in part to the different communication paths between and among tiles in the HTF, a greater number of low-latency paths can be available to realize flows than would be available using other arrays of compute resources without such paths. Since a relatively greater number of paths can be available, data flows can be further optimized by balancing other system-level interests such as resource utilization, performance, and power consumption.

Figure 6A:
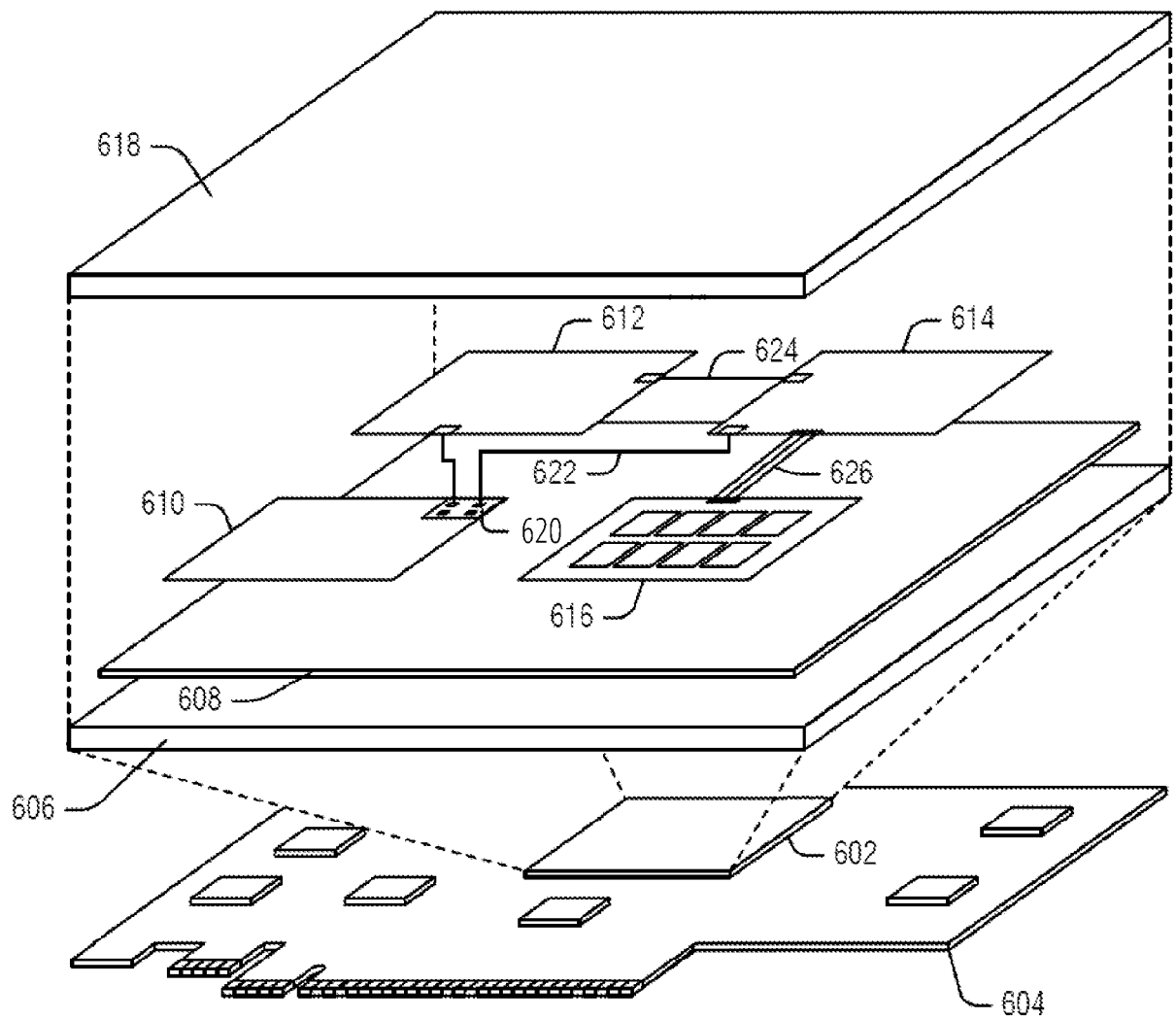
FIG. 6A illustrates generally an example of a chiplet system, according to an embodiment.
Figure 6B:
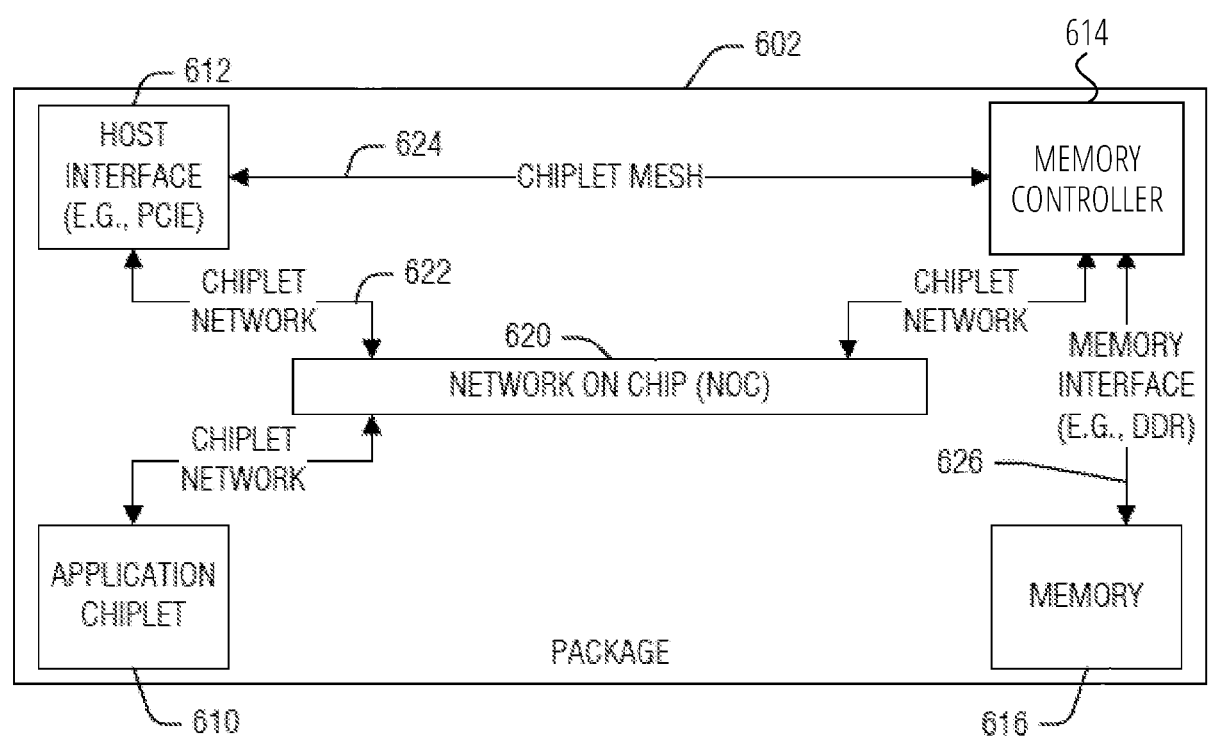
FIG. 6B illustrates generally a block diagram showing various components in the chiplet system from the example of FIG. 6A.

A compute-near-memory system, or nodes or tiles of a compute-near-memory system, can include or use various memory devices, controllers, and interconnects, among other things. In an example, the system can comprise various interconnected nodes and the nodes, or groups of nodes, can be implemented using chiplets. Chiplets are an emerging technique for integrating various processing functionality. Generally, a chiplet system is made up of discrete chips (e.g., integrated circuits (ICs) on different substrate or die) that are integrated on an interposer and packaged together. This arrangement is distinct from single chips (e.g., ICs) that contain distinct device blocks (e.g., intellectual property (IP) blocks) on one substrate (e.g., single die), such as a system-on-a-chip (SoC), or discretely packaged devices integrated on a board. In general, chiplets provide production benefits than single die chips, including higher yields or reduced development costs. FIG. 6A and FIG. 6B, discussed below, illustrate generally an example of a chiplet system such as can comprise a compute-near-memory system.

In some examples, a compute-near-memory system is programmed to arrange components of a reconfigurable compute fabric, such as the hybrid threading fabric (HTF) described herein, into one or more synchronous flows. The reconfigurable compute fabric comprises one or more hardware flow controllers and one or more hardware compute elements that can be arranged to form one or more synchronous flows, as described herein.

A compute element comprises a compute element memory and a processor or other suitable logic circuitry forming a compute pipeline for processing received data. In some examples, a compute element comprises multiple parallel processing lanes, such as single instruction multiple data (SIMD) processing lanes. A compute element can further comprise circuitry for sending and receiving synchronous and asynchronous messages to flow controllers, other compute elements, and other system components, as described herein. Example compute elements are described herein with respect to HTF tiles, such as the tiles 504, 510, 512 of FIG. 5, among others.

A flow controller can include a processor or other logic circuitry for managing a synchronous flow, as described herein. The flow controller comprises circuitry for sending synchronous and asynchronous messages to compute elements, other flow controllers, and other system components, as described herein. In some examples, a flow controller is implemented using a tile base of one or more of the HTF tiles 504, 510, 512 described herein.

A synchronous flow can include or use hardware arranged in a reconfigurable compute fabric that comprises a hardware flow controller and an ordered synchronous data path comprising one or more hardware compute elements. A synchronous flow can execute one or more threads of work. To execute a thread, the hardware components of the synchronous flow pass synchronous messages and execute a predetermined set of operations in the order of the synchronous flow.

In an example, a problem to be solved can include avoiding latency in threads or compiled HTF compute kernels, such as can result from occupied or blocked routing paths in a synchronous flow. A solution to the problem can include or use one or more delay registers at each tile in the fabric. In an example, the solution includes pipelined delay registers and output registers. The delay registers can provide a buffering location for compute results, such as can be stored for one or more clock cycles before further processing or before output to another tile or fabric location. Such buffering by the delay register or registers can help free up the corresponding connected output register, such as a synchronous fabric output, through which new or other results can be routed, thereby further enhancing throughput for each tile in the HTF.

In an example, a thread is completed when all of the compute elements of a synchronous flow complete their programmed operations in the predetermined order of the synchronous flow. When a thread is completed, a pipeline of synchronous messages will have propagated between the various compute elements in the predetermined order of the synchronous flow, beginning at the flow controller. Because the arrangement is synchronous, the completion of a thread may occur in a fixed amount of time (e.g., a predictable number of clock cycles from when the flow controller initiates the synchronous flow).

Arrangements of HTF to include synchronous flows may facilitate parallel processing. For example, a flow controller for a synchronous flow need not wait for one thread to complete before initiating an additional thread. Consider an example synchronous flow including a flow controller and multiple compute elements. The flow controller initiates a first thread by providing a synchronous message to the first compute element of the synchronous flow. The first compute element can perform its processing and direct a second synchronous message to the next compute element, and so on. After the first compute element completes its processing and directs the synchronous message to the next compute element, the flow controller can initiate an additional thread at the synchronous flow, for example, by providing an additional synchronous message to the first compute element. The dedicated delay and output registers can help coordinate timing of one or more components of the same flow or of parallel flows.

Parallelization of synchronous flows at a reconfigurable compute fabric can use compute elements that operate at a predefined cadence or Spoke Count, such as using the various tiles described herein. For example, a compute element may use a predetermined number of clock cycles to perform various operations, such as receiving synchronous messages, performing processing operations, sending synchronous messages, etc. The compute element can be configured to receive a new synchronous message and begin operations for a thread while operations from a previous thread are still propagating through a different compute element. The new thread can be a different thread of the same synchronous flow of the previous thread or can be a thread of a different synchronous flow.

A synchronous flow can use an asynchronous fabric of the reconfigurable compute fabric to communicate with other synchronous flows and/or other components of the reconfigurable compute fabric using asynchronous messages. For example, a memory interface or flow controller may receive an asynchronous message from a dispatch interface and/or from another flow controller instructing the controller to begin a thread or synchronous flow. The dispatch interface may interface between the reconfigurable compute fabric and other system components. In some examples, a synchronous flow may send an asynchronous message to the dispatch interface to indicate completion of a thread.

Asynchronous messages can be used by synchronous flows to access memory. For example, the reconfigurable compute fabric can include one or more memory interfaces. Memory interfaces are hardware components that can be used by a synchronous flow or components thereof to access an external memory that is not part of the synchronous flow. A thread executed at a synchronous flow can include sending a read and/or write request to a memory interface. Because reads and writes can be asynchronous, the thread that initiates a read or write request to the memory interface may not receive the results of the request. Instead, the results of a read or write request can be provided to a different thread executed at a different synchronous flow. Delay and output registers in one or more of the tiles can help coordinate and maximize efficiency of a first flow, for example, by precisely timing engagement of particular compute resources of one tile with arrival of data relevant to the first flow. The registers can help enable the particular compute resources of the same tile to be repurposed for flows other than the first flow, for example while the first flow dwells or waits for other data or operations to complete. Such other data or operations can depend on one or more other resources on the fabric.

In an example, a reconfigurable compute fabric can use a first synchronous flow for initiating a read request and a second synchronous flow for receiving the results of the read request. A first thread at the first synchronous flow can send an asynchronous read request message to a memory interface. The first thread can also send an asynchronous continue-type message to the flow controller of the second synchronous flow, where the continue message indicates the read request. The memory interface acquires the requested data from the memory and directs the read data to an appropriate compute element of the second synchronous flow. The compute element then directs an asynchronous message to the second flow controller indicating that the data has been received. In some examples, the memory interface provides the read data directly to the second flow controller. After receiving an indication that the read data has been received, the second flow controller initiates a thread at the second synchronous flow to further process the result of the read request.

In some examples, a reconfigurable compute fabric, such as the HTF described herein, is used to execute one or more loops, such as a set of nested loops. To execute a loop, the reconfigurable compute fabric can use flow controllers and compute elements arranged into one or more synchronous flows, as described herein. For example, the flow controller for a synchronous flow can initiate a thread at the synchronous flow for each iteration of a loop. Consider the simple example loop given by code segment [1] below:

```
[1]:
for i=1, 10 {
x[i]=x[i-1]*2;
saveMem = x[i];
}
```

A flow controller may begin the example loop by initiating a first thread at the synchronous flow for an i=1 loop iteration. In this example, an initial value for x[i-1] is passed by the flow controller to the first compute element with the payload data of the initial synchronous message. The compute element or elements of the synchronous flow determines a value for x[1] and returns the value for x[1] to the flow controller as a synchronous or asynchronous message. The flow controller then initiates a second thread at the synchronous flow for the i=2 loop iteration, passing the returned value of x[1] as x[i-1] in a synchronous message. This process continues until all iterations of the loop are completed and a value for x[10] is returned.

The example loop above uses a single synchronous flow for each iteration of the loop. In some examples, however, multiple synchronous flows can be used for each loop iteration. Consider the example loop given by code segment [2] below:

```
[2]:
for i=1, 10 {
x[i]=i*y[i];
saveMem = x[i];
}
```

In this example, each loop iteration involves multiplying i by a value y[i] read from memory, and then writing the result to memory. Accordingly, each loop iteration includes an asynchronous memory read and an asynchronous memory write. As described herein, the memory read involves sending an asynchronous message to a memory interface and then waiting for the memory interface to reply with another asynchronous message including the requested data. Because the memory read is asynchronous, each loop iteration may use synchronous flow threads executing at two different synchronous flows. For the i=1 loop iteration, a thread at a first synchronous flow sends an asynchronous message to the memory interface including a read request for the value of y[1]. The thread at the first synchronous flow may also send an asynchronous message to a second flow controller of the second synchronous flow instructing the second flow controller to expect the result of the read request (either directly from the memory interface or from a compute element of the second synchronous flow that has received the read data). The memory interface initiates a read of the value of y[1] and provides the value of y[1] to the second synchronous flow via an asynchronous message. Upon receiving an asynchronous message indicating that the read data is received, the second flow controller initiates a thread at the second synchronous flow. (The returned value of y[1] can be provided to the compute elements, for example, via synchronous communications of the thread and/or directly from the memory interface prior to initiation of the thread.) The second thread determines the value of x[1] and sends a synchronous message to the memory interface including a write request for x[1].

In some examples, the number of threads that a synchronous flow controller can initiate at a synchronous flow is limited by the resources of the components of the synchronous flow. For example, threads of a synchronous flow may write data to the various local compute element memories at the synchronous flow compute elements. If too many synchronous flow threads are initiated at the same time, some synchronous flow threads may lack sufficient local memory or other resources. This may prevent a synchronous flow thread from writing its data and/or cause it to overwrite the locally-stored data of other synchronous flow threads.

To prevent this, a reconfigurable compute fabric may limit the number of synchronous flow threads that can be initiated at a given time. For example, the reconfigurable compute fabric may implement a pool of thread identifiers (IDs). A flow controller may determine that a thread ID is available before implementing a synchronous flow thread. In some examples, the synchronous messages of a synchronous flow thread may include an indication of the thread ID for a given thread.

When a synchronous flow thread is complete, it may send an asynchronous free message, for example, to the flow controller that initiated the synchronous flow thread. This indicates to the flow controller that the thread ID (and associated resources) for the completed synchronous flow thread are now available for use by a new synchronous flow thread.

When a synchronous flow is used to execute a loop or stencil operation, the synchronous flow threads executing different iterations of the loop or stencil may read data from and/or write data to memory. For example, during execution of a synchronous flow thread, one or more compute elements may read operand data specific to the current loop iteration from compute element memory, such as a FIFO buffer. Similarly, one or more compute elements may write result data specific to the current loop iteration to compute element memory, or tile-specific memory, such as a FIFO buffer. Further, in some examples, during execution of a synchronous flow thread, a compute element may make loop-iteration specific reads from or writes to external memory via a memory interface. These read, write, compute, or other operations can create timing issues that can reduce system efficiency and resource usage. For example, compute resources may be unused or underused during various clock cycles when data is moved through the same or other compute element in a system. In an example, the system can include or use compute element delay registers with a loop-back or feedback path to help coordinate flow threads and increase resource usage, such as by avoiding output register blocking or avoiding extraneous read or write operations to temporary storage locations. In an example, the system can include or use buffers to store information for stencil operations, including a buffer to store stencil input information and the same or other buffer to store stencil operation output information. The buffers can help increase efficiency of data element accesses for stencil operations, and can help reduce an overall number of tile instructions or operations for the stencil.

FIG. 1 illustrates generally a first example of a compute-near-memory system, or CNM system 102. The example of the CNM system 102 includes multiple different memory-compute nodes, such as can each include various compute-near-memory devices. Each node in the system can operate in its own operating system (OS) domain (e.g., Linux, among others). In an example, the nodes can exist collectively in a common OS domain of the CNM system 102.

The example of FIG. 1 includes an example of a first memory-compute node 104 of the CNM system 102. The CNM system 102 can have multiple nodes, such as including different instances of the first memory-compute node 104, that are coupled using a scale fabric 106. In an example, the architecture of the CNM system 102 can support scaling with up to n different memory-compute nodes (e.g., n=4096) using the scale fabric 106. As further discussed below, each node in the CNM system 102 can be an assembly of multiple devices.

The CNM system 102 can include a global controller for the various nodes in the system, or a particular memory-compute node in the system can optionally serve as a host or controller to one or multiple other memory-compute nodes in the same system. The various nodes in the CNM system 102 can thus be similarly or differently configured.

In an example, each node in the CNM system 102 can comprise a host system that uses a specified operating system. The operating system can be common or different among the various nodes in the CNM system 102. In the example of FIG. 1, the first memory-compute node 104 comprises a host system 108, a first switch 110, and a first memory-compute device 112. The host system 108 can comprise a processor, such as can include an X86, ARM, RISC-V, or other type of processor. The first switch 110 can be configured to facilitate communication between or among devices of the first memory-compute node 104 or of the CNM system 102, such as using a specialized or other communication protocol, generally referred to herein as a chip-to-chip protocol interface (CTCPI). That is, the CTCPI can include a specialized interface that is unique to the CNM system 102, or can include or use other interfaces such as the compute express link (CXL) interface, the peripheral component interconnect express (PCIe) interface, or the chiplet protocol interface (CPI), among others. The first switch 110 can include a switch configured to use the CTCPI. For example, the first switch 110 can include a CXL switch, a PCIe switch, a CPI switch, or other type of switch. In an example, the first switch 110 can be configured to couple differently configured endpoints. For example, the first switch 110 can be configured to convert packet formats, such as between PCIe and CPI formats, among others.

The CNM system 102 is described herein in various example configurations, such as comprising a system of nodes, and each node can comprise various chips (e.g., a processor, a switch, a memory device, etc.). In an example, the first memory-compute node 104 in the CNM system 102 can include various chips implemented using chiplets. In the below-discussed chiplet-based configuration of the CNM system 102, inter-chiplet communications, as well as additional communications within the system, can use a CPI network. The CPI network described herein is an example of the CTCPI, that is, as a chiplet-specific implementation of the CTCPI. As a result, the below-described structure, operations, and functionality of CPI can apply equally to structures, operations, and functions as may be otherwise implemented using non-chiplet-based CTCPI implementations. Unless expressly indicated otherwise, any discussion herein of CPI applies equally to CTCPI.

A CPI interface includes a packet-based network that supports virtual channels to enable a flexible and high-speed interaction between chiplets, such as can comprise portions of the first memory-compute node 104 or the CNM system 102. The CPI can enable bridging from intra-chiplet networks to a broader chiplet network. For example, the Advanced eXtensible Interface (AXI) is a specification for intra-chip communications. AXI specifications, however, cover a variety of physical design options, such as the number of physical channels, signal timing, power, etc. Within a single chip, these options are generally selected to meet design goals, such as power consumption, speed, etc. However, to achieve the flexibility of a chiplet-based memory-compute system, an adapter, such as using CPI, can interface between the various AXI design options that can be implemented in the various chiplets. By enabling a physical channel-to-virtual channel mapping and encapsulating time-based signaling with a packetized protocol, CPI can be used to bridge intra-chiplet networks, such as within a particular memory-compute node, across a broader chiplet network, such as across the first memory-compute node 104 or across the CNM system 102.

The CNM system 102 is scalable to include multiple-node configurations. That is, multiple different instances of the first memory-compute node 104, or of other differently configured memory-compute nodes, can be coupled using the scale fabric 106, to provide a scaled system. Each of the memory-compute nodes can run its own operating system and can be configured to jointly coordinate system-wide resource usage.

In the example of FIG. 1, the first switch 110 of the first memory-compute node 104 is coupled to the scale fabric 106. The scale fabric 106 can provide a switch (e.g., a CTCPI switch, a PCIe switch, a CPI switch, or other switch) that can facilitate communication among and between different memory-compute nodes. In an example, the scale fabric 106 can help various nodes communicate in a partitioned global address space (PGAS).

In an example, the first switch 110 from the first memory-compute node 104 is coupled to one or multiple different memory-compute devices, such as including the first memory-compute device 112. The first memory-compute device 112 can comprise a chiplet-based architecture referred to herein as a compute-near-memory (CNM) chiplet. A packaged version of the first memory-compute device 112 can include, for example, one or multiple CNM chiplets. The chiplets can be communicatively coupled using CTCPI for high bandwidth and low latency.

In the example of FIG. 1, the first memory-compute device 112 can include a network on chip (NOC) or first NOC 118. Generally, a NOC is an interconnection network within a device, connecting a particular set of endpoints. In FIG. 1, the first NOC 118 can provide communications and connectivity between the various memory, compute resources, and ports of the first memory-compute device 112.

In an example, the first NOC 118 can comprise a folded Clos topology, such as within each instance of a memory-compute device, or as a mesh that couples multiple memory-compute devices in a node. The Clos topology, such as can use multiple, smaller radix crossbars to provide functionality associated with a higher radix crossbar topology, offers various benefits. For example, the Clos topology can exhibit consistent latency and bisection bandwidth across the NOC.

The first NOC 118 can include various distinct switch types including hub switches, edge switches, and endpoint switches. Each of the switches can be constructed as crossbars that provide substantially uniform latency and bandwidth between input and output nodes. In an example, the endpoint switches and the edge switches can include two separate crossbars, one for traffic headed to the hub switches, and the other for traffic headed away from the hub switches. The hub switches can be constructed as a single crossbar that switches all inputs to all outputs.

In an example, the hub switches can have multiple ports each (e.g., four or six ports each), such as depending on whether the particular hub switch participates in inter-chip communications. A number of hub switches that participates in inter-chip communications can be set by an inter-chip bandwidth requirement.

The first NOC 118 can support various payloads (e.g., from 8 to 64-byte payloads; other payload sizes can similarly be used) between compute elements and memory. In an example, the first NOC 118 can be optimized for relatively smaller payloads (e.g., 8-16 bytes) to efficiently handle access to sparse data structures.

In an example, the first NOC 118 can be coupled to an external host via a first physical-layer interface 114, a PCIe subordinate module 116 or endpoint, and a PCIe principal module 126 or root port. That is, the first physical-layer interface 114 can include an interface to allow an external host processor to be coupled to the first memory-compute device 112. An external host processor can optionally be coupled to one or multiple different memory-compute devices, such as using a PCIe switch or other, native protocol switch. Communication with the external host processor through a PCIe-based switch can limit device-to-device communication to that supported by the switch. Communication through a memory-compute device-native protocol switch such as using CTCPI, in contrast, can allow for more full communication between or among different memory-compute devices, including support for a partitioned global address space, such as for creating threads of work and sending events.

In an example, the CTCPI protocol can be used by the first NOC 118 in the first memory-compute device 112, and the first switch 110 can include a CTCPI switch. The CTCPI switch can allow CTCPI packets to be transferred from a source memory-compute device, such as the first memory-compute device 112, to a different, destination memory-compute device (e.g., on the same or other node), such as without being converted to another packet format.

In an example, the first memory-compute device 112 can include an internal host processor 122. The internal host processor 122 can be configured to communicate with the first NOC 118 or other components or modules of the first memory-compute device 112, for example, using the internal PCIe principal module 126, which can help eliminate a physical layer that would consume time and energy. In an example, the internal host processor 122 can be based on a RISC-V ISA processor, and can use the first physical-layer interface 114 to communicate outside of the first memory-compute device 112, such as to other storage, networking, or other peripherals to the first memory-compute device 112. The internal host processor 122 can control the first memory-compute device 112 and can act as a proxy for operating system-related functionality. The internal host processor 122 can include a relatively small number of processing cores (e.g., 2-4 cores) and a host memory device 124 (e.g., comprising a DRAM module).

In an example, the internal host processor 122 can include PCI root ports. When the internal host processor 122 is in use, then one of its root ports can be connected to the PCIe subordinate module 116. Another of the root ports of the internal host processor 122 can be connected to the first physical-layer interface 114, such as to provide communication with external PCI peripherals. When the internal host processor 122 is disabled, then the PCIe subordinate module 116 can be coupled to the first physical-layer interface 114 to allow an external host processor to communicate with the first NOC 118. In an example of a system with multiple memory-compute devices, the first memory-compute device 112 can be configured to act as a system host or controller. In this example, the internal host processor 122 can be in use, and other instances of internal host processors in the respective other memory-compute devices can be disabled.

The internal host processor 122 can be configured at power-up of the first memory-compute device 112, such as to allow the host to initialize. In an example, the internal host processor 122 and its associated data paths (e.g., including the first physical-layer interface 114, the PCIe subordinate module 116, etc.) can be configured from input pins to the first memory-compute device 112. One or more of the pins can be used to enable or disable the internal host processor 122 and configure the PCI (or other) data paths accordingly.

In an example, the first NOC 118 can be coupled to the scale fabric 106 via a scale fabric interface module 136 and a second physical-layer interface 138. The scale fabric interface module 136, or SIF, can facilitate communication between the first memory-compute device 112 and a device space, such as a partitioned global address space (PGAS). The PGAS can be configured such that a particular memory-compute device, such as the first memory-compute device 112, can access memory or other resources on a different memory-compute device (e.g., on the same or different node), such as using a load/store paradigm. Various scalable fabric technologies can be used, including CTCPI, CPI, Gen-Z, PCI, or Ethernet bridged over CXL. The scale fabric 106 can be configured to support various packet formats. In an example, the scale fabric 106 supports orderless packet communications, or supports ordered packets such as can use a path identifier to spread bandwidth across multiple equivalent paths. The scale fabric 106 can generally support remote operations such as remote memory read, write, and other built-in atomics, remote memory atomics, remote memory-compute device send events, and remote memory-compute device call and return operations.

In an example, the first NOC 118 can be coupled to one or multiple different memory modules, such as including a first memory device 128. The first memory device 128 can include various kinds of memory devices, for example, LPDDR5 or GDDR6, among others. In the example of FIG. 1, the first NOC 118 can coordinate communications with the first memory device 128 via a memory controller 130 that can be dedicated to the particular memory module. In an example, the memory controller 130 can include a memory module cache and an atomic operations module. The atomic operations module can be configured to provide relatively high-throughput atomic operators, such as including integer and floating-point operators. The atomic operations module can be configured to apply its operators to data within the memory module cache (e.g., comprising SRAM memory side cache), thereby allowing back-to-back atomic operations using the same memory location, with minimal throughput degradation.

The memory module cache can provide storage for frequently accessed memory locations, such as without having to re-access the first memory device 128. In an example, the memory module cache can be configured to cache data only for a particular instance of the memory controller 130. In an example, the memory controller 130 includes a DRAM controller configured to interface with the first memory device 128, such as including DRAM devices. The memory controller 130 can provide access scheduling and bit error management, among other functions.

In an example, the first NOC 118 can be coupled to a hybrid threading processor (HTP 140), a hybrid threading fabric (HTF 142) and a host interface and dispatch module (HIF 120). The HIF 120 can be configured to facilitate access to host-based command request queues and response queues. In an example, the HIF 120 can dispatch new threads of execution on processor or compute elements of the HTP 140 or the HTF 142. In an example, the HIF 120 can be configured to maintain workload balance across the HTP 140 module and the HTF 142 module.

The hybrid threading processor, or HTP 140, can include an accelerator, such as can be based on a RISC-V instruction set. The HTP 140 can include a highly threaded, event-driven processor in which threads can be executed in single instruction rotation, such as to maintain high instruction throughput. The HTP 140 comprises relatively few custom instructions to support low-overhead threading capabilities, event send/receive, and shared memory atomic operators.

The hybrid threading fabric, or HTF 142, can include an accelerator, such as can include a non-von Neumann, coarse-grained, reconfigurable processor. The HTF 142 can be optimized for high-level language operations and data types (e.g., integer or floating point). In an example, the HTF 142 can support data flow computing. The HTF 142 can be configured to use substantially all of the memory bandwidth available on the first memory-compute device 112, such as when executing memory-bound compute kernels.

The HTP and HTF accelerators of the CNM system 102 can be programmed using various high-level, structured programming languages. For example, the HTP and HTF accelerators can be programmed using C/C++, such as using the LLVM compiler framework. The HTP accelerator can leverage an open source compiler environment, such as with various added custom instruction sets configured to improve memory access efficiency, provide a message passing mechanism, and manage events, among other things. In an example, the HTF accelerator can be designed to enable programming of the HTF 142 using a high-level programming language, and the compiler can generate a simulator configuration file or a binary file that runs on the HTF 142 hardware. The HTF 142 can provide a mid-level language for expressing algorithms precisely and concisely, while hiding configuration details of the HTF accelerator itself. In an example, the HTF accelerator tool chain can use an LLVM front-end compiler and the LLVM intermediate representation (IR) to interface with an HTF accelerator back end.

Figure 2:
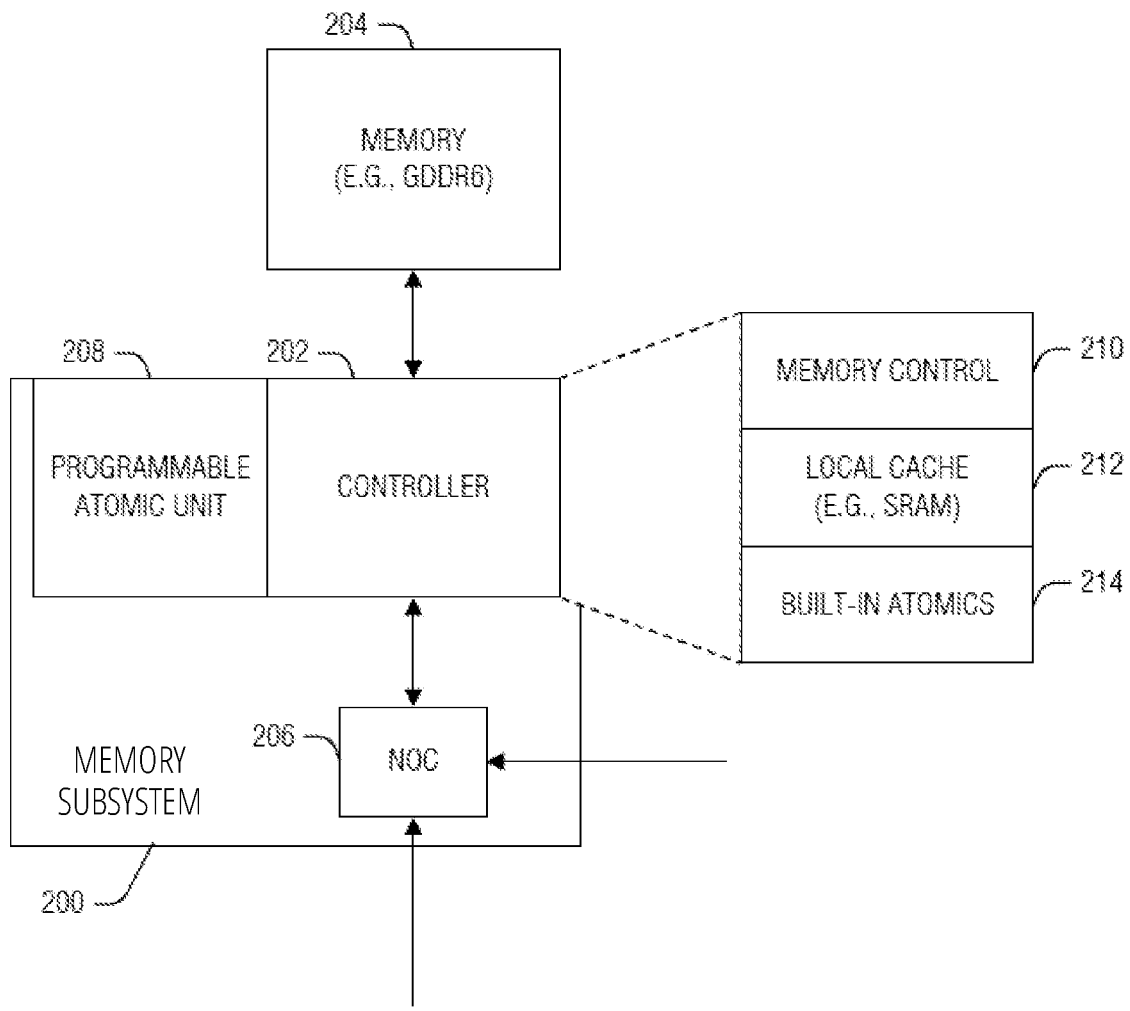
FIG. 2 illustrates generally an example of a memory subsystem of a memory-compute device, according to an embodiment.

FIG. 2 illustrates generally an example of a memory subsystem 200 of a memory-compute device, according to an embodiment. The example of the memory subsystem 200 includes a controller 202, a programmable atomic unit 208, and a second NOC 206. The controller 202 can include or use the programmable atomic unit 208 to carry out operations using information in a memory device 204. In an example, the memory subsystem 200 comprises a portion of the first memory-compute device 112 from the example of FIG. 1, such as including portions of the first NOC 118 or of the memory controller 130.

In the example of FIG. 2, the second NOC 206 is coupled to the controller 202 and the controller 202 can include a memory control module 210, a local cache module 212, and a built-in atomics module 214. In an example, the built-in atomics module 214 can be configured to handle relatively simple, single-cycle, integer atomics. The built-in atomics module 214 can perform atomics at the same throughput as, for example, normal memory read or write operations. In an example, an atomic memory operation can include a combination of storing data to the memory, performing an atomic memory operation, and then responding with load data from the memory.

The local cache module 212, such as can include an SRAM cache, can be provided to help reduce latency for repetitively-accessed memory locations. In an example, the local cache module 212 can provide a read buffer for sub-memory line accesses. The local cache module 212 can be particularly beneficial for compute elements that have relatively small or no data caches.

The memory control module 210, such as can include a DRAM controller, can provide low-level request buffering and scheduling, such as to provide efficient access to the memory device 204, such as can include a DRAM device. In an example, the memory device 204 can include or use a GDDR6 DRAM device, such as having 16 Gb density and 64 Gb/sec peak bandwidth. Other devices can similarly be used.

In an example, the programmable atomic unit 208 can comprise single-cycle or multiple-cycle operator such as can be configured to perform integer addition or more complicated multiple-instruction operations such as bloom filter insert. In an example, the programmable atomic unit 208 can be configured to perform load and store-to-memory operations. The programmable atomic unit 208 can be configured to leverage the RISC-V ISA with a set of specialized instructions to facilitate interactions with the controller 202 to atomically perform user-defined operations.

Programmable atomic requests, such as received from an on-node or off-node host, can be routed to the programmable atomic unit 208 via the second NOC 206 and the controller 202. In an example, custom atomic operations (e.g., carried out by the programmable atomic unit 208) can be identical to built-in atomic operations (e.g., carried out by the built-in atomics module 214) except that a programmable atomic operation can be defined or programmed by the user rather than the system architect. In an example, programmable atomic request packets can be sent through the second NOC 206 to the controller 202, and the controller 202 can identify the request as a custom atomic. The controller 202 can then forward the identified request to the programmable atomic unit 208.

Figure 3:
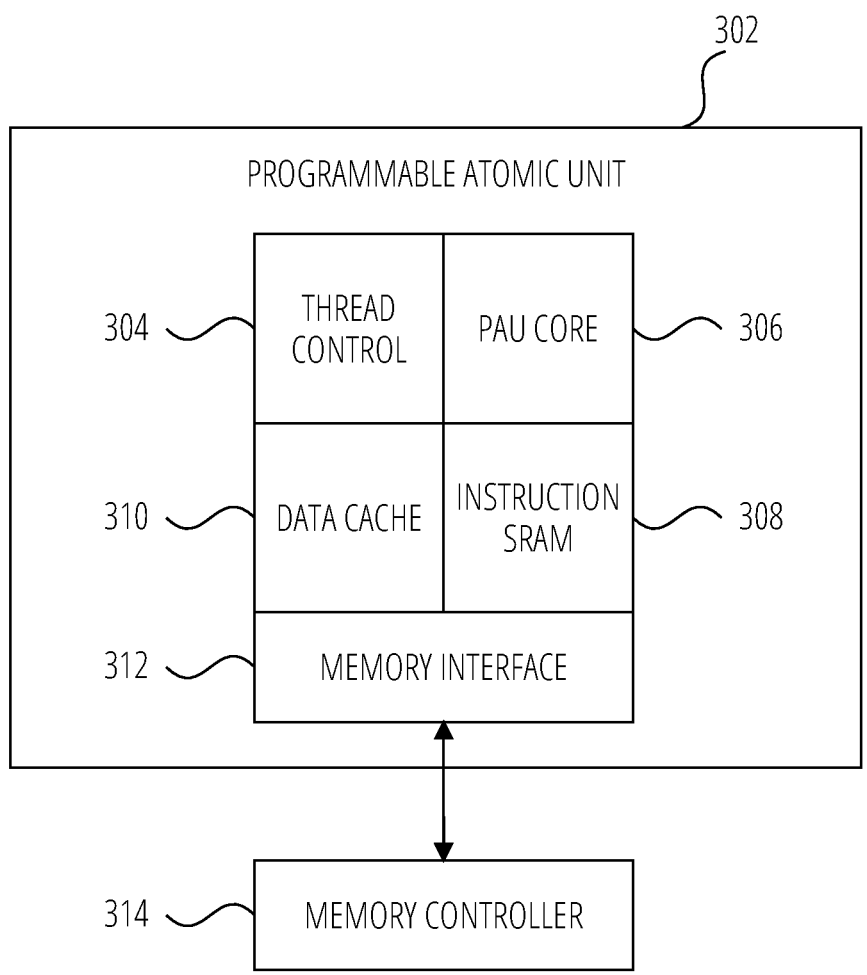
FIG. 3 illustrates generally an example of a programmable atomic unit for a memory controller, according to an embodiment.

FIG. 3 illustrates generally an example of a programmable atomic unit 302 for use with a memory controller, according to an embodiment. In an example, the programmable atomic unit 302 can comprise or correspond to the programmable atomic unit 208 from the example of FIG. 2. That is, FIG. 3 illustrates components in an example of a programmable atomic unit 302 (PAU), such as those noted above with respect to FIG. 2 (e.g., in the programmable atomic unit 208), or to FIG. 1 (e.g., in an atomic operations module of the memory controller 130). As illustrated in FIG. 3, the programmable atomic unit 302 includes a PAU processor or PAU core 306, a PAU thread control 304, an instruction SRAM 308, a data cache 310, and a memory interface 312 to interface with the memory controller 314. In an example, the memory controller 314 comprises an example of the controller 202 from the example of FIG. 2.

In an example, the PAU core 306 is a pipelined processor such that multiple stages of different instructions are executed together per clock cycle. The PAU core 306 can include a barrel-multithreaded processor, with thread control 304 circuitry to switch between different register files (e.g., sets of registers containing current processing state) upon each clock cycle. This enables efficient context switching between currently executing threads. In an example, the PAU core 306 supports eight threads, resulting in eight register files. In an example, some or all of the register files are not integrated into the PAU core 306, but rather reside in a local data cache 310 or the instruction SRAM 308. This reduces circuit complexity in the PAU core 306 by eliminating the traditional flip-flops used for registers in such memories.

The local PAU memory can include instruction SRAM 308, such as can include instructions for various atomics. The instructions comprise sets of instructions to support various application-loaded atomic operators. When an atomic operator is requested, such as by an application chiplet, a set of instructions corresponding to the atomic operator are executed by the PAU core 306. In an example, the instruction SRAM 308 can be partitioned to establish the sets of instructions. In this example, the specific programmable atomic operator being requested by a requesting process can identify the programmable atomic operator by the partition number. The partition number can be established when the programmable atomic operator is registered with (e.g., loaded onto) the programmable atomic unit 302. Other metadata for the programmable instructions can be stored in memory (e.g., in partition tables) in memory local to the programmable atomic unit 302.

In an example, atomic operators manipulate the data cache 310, which is generally synchronized (e.g., flushed) when a thread for an atomic operator completes. Thus, aside from initial loading from the external memory, such as from the memory controller 314, latency can be reduced for most memory operations during execution of a programmable atomic operator thread.

A pipelined processor, such as the PAU core 306, can experience an issue when an executing thread attempts to issue a memory request if an underlying hazard condition would prevent such a request. Here, the memory request is to retrieve data from the memory controller 314, whether it be from a cache on the memory controller 314 or off-die memory. To resolve this issue, the PAU core 306 is configured to deny the memory request for a thread. Generally, the PAU core 306 or the thread control 304 can include circuitry to enable one or more thread rescheduling points in the pipeline. Here, the denial occurs at a point in the pipeline that is beyond (e.g., after) these thread rescheduling points. In an example, the hazard occurred beyond the rescheduling point. Here, a preceding instruction in the thread created the hazard after the memory request instruction passed the last thread rescheduling point prior to the pipeline stage in which the memory request could be made.

In an example, to deny the memory request, the PAU core 306 is configured to determine (e.g., detect) that there is a hazard on memory indicated in the memory request. Here, hazard denotes any condition such that allowing (e.g., performing) the memory request will result in an inconsistent state for the thread. In an example, the hazard is an in-flight memory request. Here, whether or not the data cache 310 includes data for the requested memory address, the presence of the in-flight memory request makes it uncertain what the data in the data cache 310 at that address should be. Thus, the thread must wait for the in-flight memory request to be completed to operate on current data. The hazard is cleared when the memory request completes.

In an example, the hazard is a dirty cache line in the data cache 310 for the requested memory address. Although the dirty cache line generally indicates that the data in the cache is current and the memory controller version of this data is not, an issue can arise on thread instructions that do not operate from the cache. An example of such an instruction uses a built-in atomic operator, or other separate hardware block, of the memory controller 314. In the context of a memory controller, the built-in atomic operators can be separate from the programmable atomic unit 302 and do not have access to the data cache 310 or instruction SRAM 308 inside the PAU. If the cache line is dirty, then the built-in atomic operator will not be operating on the most current data until the data cache 310 is flushed to synchronize the cache and the other or off-die memories. This same situation could occur with other hardware blocks of the memory controller, such as cryptography block, encoder, etc.

Figure 4:
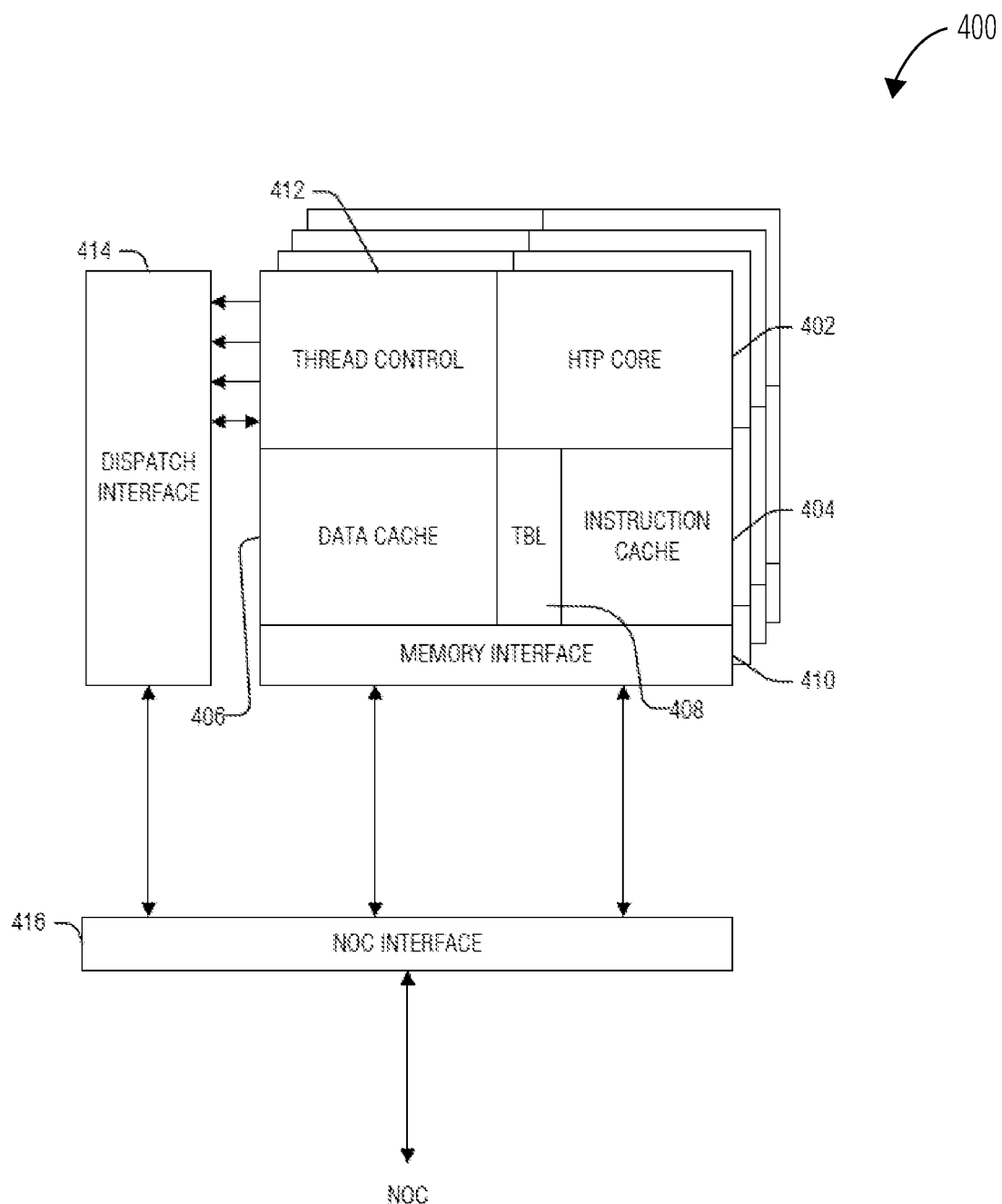
FIG. 4 illustrates an example of a hybrid threading processor (HTP) accelerator of a memory-compute device, according to an embodiment.

FIG. 4 illustrates an example of a hybrid threading processor (HTP) accelerator, or HTP accelerator 400. The HTP accelerator 400 can comprise a portion of a memory-compute device, according to an embodiment. In an example, the HTP accelerator 400 can include or comprise the HTP 140 from the example of FIG. 1. The HTP accelerator 400 includes, for example, a HTP core 402, an instruction cache 404, a data cache 406, a translation block 408, a memory interface 410, and a thread controller 412. The HTP accelerator 400 can further include a dispatch interface 414 and a NOC interface 416, such as for interfacing with a NOC such as the first NOC 118 from the example of FIG. 1, the second NOC 206 from the example of FIG. 2, or other NOC.

In an example, the HTP accelerator 400 includes a module that is based on a RISC-V instruction set, and can include a relatively small number of other or additional custom instructions to support a low-overhead, threading-capable Hybrid Threading (HT) language. The HTP accelerator 400 can include a highly-threaded processor core, the HTP core 402, in which, or with which, threads can be executed in a single instruction rotation, such as to maintain high instruction throughput. In an example, a thread can be paused when it waits for other, pending events to complete. This can allow the compute resources to be efficiently used on relevant work instead of polling. In an example, multiple-thread barrier synchronization can use efficient HTP-to-HTP and HTP-to/from-Host messaging, such as can allow thousands of threads to initialize or wake in, for example, tens of clock cycles.

In an example, the dispatch interface 414 can comprise a functional block of the HTP accelerator 400 for handling hardware-based thread management. That is, the dispatch interface 414 can manage dispatch of work to the HTP core 402 or other accelerators. Non-HTP accelerators, however, are generally not able to dispatch work. In an example, work dispatched from a host can use dispatch queues that reside in, e.g., host main memory (e.g., DRAM-based memory). Work dispatched from the HTP accelerator 400, on the other hand, can use dispatch queues that reside in SRAM, such as within the dispatches for the target HTP accelerator 400 within a particular node.

In an example, the HTP core 402 can comprise one or more cores that execute instructions on behalf of threads. That is, the HTP core 402 can include an instruction processing block. The HTP core 402 can further include, or can be coupled to, the thread controller 412. The thread controller 412 can provide thread control and state for each active thread within the HTP core 402. The data cache 406 can include cache for a host processor (e.g., for local and remote memory-compute devices, including for the HTP core 402), and the instruction cache 404 can include cache for use by the HTP core 402. In an example, the data cache 406 can be configured for read and write operations, and the instruction cache 404 can be configured for read only operations.

In an example, the data cache 406 is a small cache provided per hardware thread. The data cache 406 can temporarily store data for use by the owning thread. The data cache 406 can be managed by hardware or software in the HTP accelerator 400. For example, hardware can be configured to automatically allocate or evict lines as needed, as load and store operations are executed by the HTP core 402. Software, such as using RISC-V instructions, can determine which memory accesses should be cached, and when lines should be invalidated or written back to other memory locations.

Data caching on the HTP accelerator 400 has various benefits, including making larger accesses more efficient for the memory controller, allowing an executing thread to avoid stalling. However, there are situations when using the cache causes inefficiencies. An example includes accesses where data is accessed only once, and causes thrashing of the cache lines. To help address this problem, the HTP accelerator 400 can use a set of custom load instructions to force a load instruction to check for a cache hit, and on a cache miss to issue a memory request for the requested operand and not put the obtained data in the data cache 406. The HTP accelerator 400 thus includes various different types of load instructions, including non-cached and cache line loads. The non-cached load instructions use the cached data if dirty data is present in the cache. The non-cached load instructions ignore clean data in the cache, and do not write accessed data to the data cache. For cache line load instructions, the complete data cache line (e.g., comprising 64 bytes) can be loaded from memory into the data cache 406, and can load the addressed memory into a specified register. These loads can use the cached data if clean or dirty data is in the data cache 406. If the referenced memory location is not in the data cache 406, then the entire cache line can be accessed from memory. Use of the cache line load instructions can reduce cache misses when sequential memory locations are being referenced (such as memory copy operations) but can also waste memory and bandwidth at the NOC interface 416 if the referenced memory data is not used.

In an example, the HTP accelerator 400 includes a custom store instruction that is non-cached. The non-cached store instruction can help avoid thrashing the data cache 406 with write data that is not sequentially written to memory.

In an example, the HTP accelerator 400 further includes a translation block 408. The translation block 408 can include a virtual-to-physical translation block for local memory of a memory-compute device. For example, a host processor, such as in the HTP core 402, can execute a load or store instruction, and the instruction can generate a virtual address. The virtual address can be translated to a physical address of the host processor, such as using a translation table from the translation block 408. The memory interface 410, for example, can include an interface between the HTP core 402 and the NOC interface 416.

Figure 5:
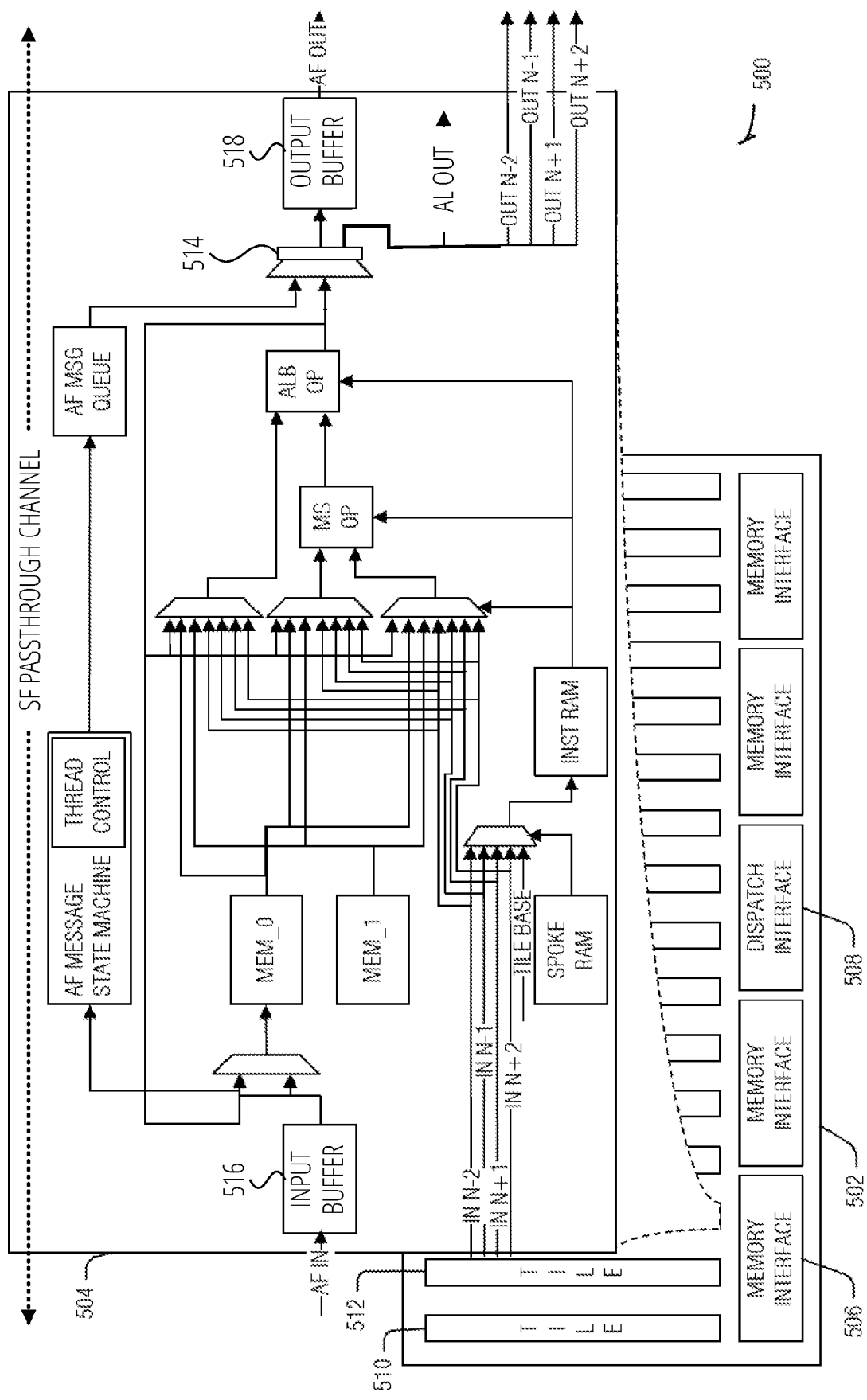
FIG. 5 illustrates an example of a representation of a hybrid threading fabric (HTF) of a memory-compute device, according to an embodiment.

FIG. 5 illustrates an example of a representation of a hybrid threading fabric (HTF), or HTF 500, of a memory-compute device, according to an embodiment. In an example, the HTF 500 can include or comprise the HTF 142 from the example of FIG. 1. The HTF 500 is a coarse-grained, reconfigurable compute fabric that can be optimized for high-level language operand types and operators (e.g., using C/C++ or other high-level language). In an example, the HTF 500 can include configurable, n-bit wide (e.g., 512-bit wide) data paths that interconnect hardened SIMD arithmetic units.

In an example, the HTF 500 comprises an HTF cluster 502 that includes multiple HTF tiles, including an example tile 504, or Tile N. Each HTF tile can comprise one or more compute elements with local tile memory or compute element memory and arithmetic functions. For example, each tile can include a compute pipeline with support for integer and floating-point operations. In an example, the data path, compute elements, and other infrastructure can be implemented as hardened IP to provide maximum performance while minimizing power consumption and reconfiguration time.

In the example of FIG. 5, the tiles in the HTF cluster 502 are coupled using a synchronous fabric (SF), or synchronous compute fabric, to perform synchronous dataflows. The synchronous fabric can provide communication between a particular tile and its neighboring tiles in the HTF cluster 502. Each HTF cluster 502 can further include an asynchronous fabric (AF), or asynchronous compute fabric, that can provide communication among, e.g., the tiles in the cluster, the memory interfaces in the cluster, and a dispatch interface 508 in the cluster.

In an example, the synchronous fabric can exchange messages that include data and control information. The control information can include, among other things, instruction RAM address information or a thread identifier. The control information can be used to set up a data path, and a data message field can be selected as a source for the path. Generally, the control fields can be provided or received earlier, such that they can be used to configure the data path. For example, to help minimize any delay through the synchronous flow pipeline in a tile, the control information can arrive at a tile a few clock cycles before the data field. Various registers can be provided to help coordinate dataflow timing in the pipeline. In an example, the control information can comprise a bitmask portion of data communicated throughout the HTF cluster 502.

In an example, compute elements or tiles in a coarse-grained, reconfigurable architecture or fabric can be arranged a two-dimensional array, such as with data communication and connectivity between nearest neighbors. In a two-dimensional array of compute elements, each element can have up to four connections to its nearest neighbors. However, in such a two-dimensional array, corner compute elements connect to two neighbors and other non-corner edge compute elements connect to three neighbors. For arrays with small numbers of compute elements, a relatively large number of the elements are therefore treated as special cases when programming the array. For example, in a sixteen-element array, arranged as a two-dimensional 4×4 array, there are four corners (comprising 25% of the total number of array elements) with two-neighbor connections, eight edges (comprising 50% of the total number of array elements) with three-neighbor connections, and four fully-connected elements (comprising 25% of the total number of array elements) with four-neighbor connections.

The present inventor has recognized, however, that compute elements arranged in a one-dimensional array with connections to nearest neighbors and to neighbors one-hop, or one device space, away can offer better connectivity for applications, and more flexibility to kernel compilers, than is available using a multidimensional array. The present inventor has further recognized that providing a passthrough channel in some or all array elements can further enhance connectivity between non-adjacent tiles in the array.

For example, a one-dimensional array can have more compute elements or tiles that are fully connected (e.g., with four connections per tile). In an example of a sixteen-element array, arranged as a one-dimensional 1×16 array, there are two corners (comprising 12.5% of the total number of array elements) with two-neighbor connections, two edges (comprising 12.5% of the total number of array elements) with three-neighbor connections, and twelve fully connected elements (comprising 75% of the total number of array elements). In other words, in the sixteen-element array example, the one-dimensional array provides a configuration with 75% of the tiles fully connected and with 25% of the tiles as special, reduced-connectivity cases. Accordingly, the one-dimensional array can provide a compiler or scheduler more flexibility when assigning operations to each tile. A pictorial example of a 1×16 array is provided at FIG. 9 and discussed below.

In the example of FIG. 5, the tiles comprising the HTF cluster 502 are linearly arranged, such as in a 1×16 array, and each tile in the cluster can be coupled to one or multiple other tiles in the HTF cluster 502. In the example of FIG. 5, the example tile 504, or Tile N, is coupled to four other tiles, including to a base tile 510 (e.g., Tile N-2) via the port labeled SF IN N-2, to an adjacent tile 512 (e.g., Tile N-1) via the port labeled SF IN N-1, and to a Tile N+1 via the port labeled SF IN N+1 and to a Tile N+2 via the port labeled SF IN N+2. A tile can include a base portion, such as can include hardware that is configured to initiate threads or otherwise act as a flow controller. The example tile 504 can be coupled to the same or other tiles via respective output ports, such as those labeled SF OUT N-1, SF OUT N-2, SF OUT N+1, and SF OUT N+2. In this example, the ordered list of names for the various tiles are notional indications of the positions of the tiles. In other examples, the tiles comprising the HTF cluster 502 can be arranged in a grid, loop, or other configuration, with each tile similarly coupled to one or several of its nearest neighbors in the grid. Tiles that are provided at an edge of a cluster can optionally have fewer connections to neighboring tiles. For example, Tile N-2, or the base tile 510 in the example of FIG. 5, can be coupled only to the adjacent tile 512 (Tile N-1) and to the example tile 504 (Tile N). Fewer or additional inter-tile connections can similarly be used.

In the example of FIG. 5, the example tile 504 can include a passthrough channel that can provide a low-latency communication datapath, comprising a portion of the synchronous fabric, between non-adjacent tiles. That is, non-adjacent tiles in an array can be effectively directly coupled using a passthrough channel of one or more intervening tiles. In an illustrative example including Tile N-1, Tile N, and Tile N+1, a passthrough channel in Tile N can be used to couple synchronous fabric inputs and outputs of Tile N-1 and Tile N+1.

The HTF cluster 502 can further include memory interface modules, including a first memory interface module 506. The memory interface modules can couple the HTF cluster 502 to a NOC, such as the first NOC 118. In an example, the memory interface modules can allow tiles within a cluster to make requests to other locations in a memory-compute system, such as in the same or different node in the system. That is, the representation of the HTF 500 can comprise a portion of a larger fabric that can be distributed across multiple nodes, such as with one or more HTF tiles or HTF clusters at each of the nodes. Requests can be made between tiles or nodes within the context of the larger fabric.

In an example, each tile in the HTF cluster 502 can include one or more tile memories. Each tile memory can have the same width as the data path (e.g., 512 bits) and can have a specified depth, such as in a range of 512 to 1024 (deleted) elements. The tile memories can be used to store data that supports data path operations. The stored data can include constants loaded as part of a kernel's cluster configuration, for example, or can include variables calculated as part of the data flow. In an example, the tile memories can be written from the asynchronous fabric as a data transfer from another synchronous flow, or can include a result of a load operation such as initiated by another synchronous flow. The tile memory can be read via synchronous data path instruction execution in the synchronous flow.

In an example, each tile in an HTF cluster 502 can have a dedicated instruction RAM (INST RAM). In an example of an HTF cluster 502 with sixteen tiles, and respective instruction RAM instances with sixty-four entries, the cluster can allow algorithms to be mapped with up to 1024 (deleted) multiply-shift and/or ALU operations. The various tiles can optionally be pipelined together, such as using the synchronous fabric, to allow data flow compute with minimal memory access, thus minimizing latency and reducing power consumption. In an example, the asynchronous fabric can allow memory references to proceed in parallel with computation, thereby providing more efficient streaming kernels. In an example, the various tiles can include built-in support for loop-based constructs, and can support nested looping kernels.

The synchronous fabric can allow multiple tiles to be pipelined, such as without a need for data queuing. Tiles that participate in a synchronous domain or synchronous flow can, for example, act as a single pipelined data path. A first or base tile (e.g., Tile N-2, in the example of FIG. 5) of a synchronous flow can initiate a thread of work through the pipelined tiles. The base tile or flow controller can be responsible for starting work on a predefined cadence referred to herein as a Spoke Count. For example, if the Spoke Count is 3, then the base tile can initiate work, or a thread, every third clock cycle.

In an example, a synchronous domain, or elements configured to perform a synchronous flow, comprises a set of connected tiles in the HTF cluster 502. Execution of a thread can begin at the domain's base tile and can progress from the base or flow controller, via the synchronous fabric, to other tiles or compute elements that are a part of the same flow, or in the same domain. The flow controller can provide the instruction to be executed for the first tile. The first tile can, by default, provide the same instruction for the other connected tiles to execute. However, in some examples, the base tile, or a subsequent tile, can conditionally specify or use an alternative instruction. The alternative instruction can be chosen by having the tile's data path produce a Boolean conditional value, and then can use the Boolean value to choose between an instruction set of the current tile and the alternate instruction.

The asynchronous fabric can be used to perform operations that occur asynchronously relative to a synchronous flow. Each tile in the HTF cluster 502 can include an interface to the asynchronous fabric. In an example, an inbound asynchronous fabric interface can include an input buffer 516, for example, a FIFO buffer or queue (e.g., AF IN QUEUE). The input buffer 516 can provide storage for messages that are or are not immediately processed upon receipt. Similarly, an outbound asynchronous fabric interface can include an output buffer 518, for example, a FIFO buffer or queue (e.g., AF OUT QUEUE). The output buffer 518 can provide storage for messages that are or are not immediately sent out to another portion of the asynchronous fabric.

In an example, messages in the asynchronous fabric can be classified as data messages or control messages. Data messages can include a SIMD width data value that is written to either tile memory 0 (MEM_0) or memory 1 (MEM_1). Control messages can be configured to control thread creation, to free resources, or to issue external memory references.

A tile in the HTF cluster 502 can perform various compute operations for the HTF. The compute operations can be performed by configuring the data path within the tile and/or compute elements thereof. In an example, a tile includes two functional blocks that perform the compute operations for the tile: a Multiply and Shift Operation block (MS OP) and an Arithmetic, Logical, and Bit Operation block (ALB OP). The two blocks can be configured to perform pipelined operations such as a Multiply and Add, or a Shift and Add, among others. Results from one or more of the functional blocks, or information from an asynchronous fabric queue, can be stored or processed at an output register assembly 514.

In an example, each instance of a memory-compute device in a system can have a complete supported instruction set for its operator blocks (e.g., MS OP and ALB OP). In this case, binary compatibility can be realized across all devices in the system. However, in some examples, it can be helpful to maintain a base set of functionality and optional instruction set classes, such as to meet various design tradeoffs, such as die size. The approach can be similar to how the RISC-V instruction set has a base set and multiple optional instruction subsets.

In an example, the example tile 504 can include a Spoke RAM. The Spoke RAM can be used to specify which input (e.g., from among the four SF tile inputs and the base input) is the primary input for each clock cycle. The Spoke RAM read address input can originate at a counter that counts from zero to Spoke Count minus one.

In an example, different Spoke Counts can be used on different tiles, such as within the same HTF cluster 502, to allow a number of slices, or unique tile instances, used by an inner loop to determine the performance of a particular application or instruction set. In an example, the Spoke RAM can specify when a synchronous input is to be written to a tile memory, for instance when multiple inputs for a particular tile instruction are used and one of the inputs arrives before the others. The early-arriving input can be written to the tile memory and can be later read when all of the inputs are available. In this example, the tile memory (e.g., MEM_0 or MEM_1) can be accessed as a FIFO memory, and FIFO read and write pointers can be stored in a register-based memory region or structure in the tile memory.

FIG. 6A and FIG. 6B illustrate generally an example of a chiplet system that can be used to implement one or more aspects of the CNM system 102. As similarly mentioned above, a node in the CNM system 102, or a device within a node in the CNM system 102, can include a chiplet-based architecture or compute-near-memory (CNM) chiplet. A packaged memory-compute device can include, for example, one, two, or four CNM chiplets. The chiplets can be interconnected using high-bandwidth, low-latency interconnects such as using a CPI interface. Generally, a chiplet system is made up of discrete modules (each a "chiplet") that are integrated on an interposer and, in many examples, are interconnected as desired through one or more established networks to provide a system with the desired functionality. The interposer and included chiplets can be packaged together to facilitate interconnection with other components of a larger system. Each chiplet can include one or more individual integrated circuits (ICs), or "chips," potentially in combination with discrete circuit components, and can be coupled to a respective substrate to facilitate attachment to the interposer. Most or all chiplets in a system can be individually configured for communication through established networks.

The configuration of chiplets as individual modules of a system is distinct from such a system being implemented on single chips that contain distinct device blocks (e.g., intellectual property (IP) blocks) on one substrate (e.g., single die), such as a system-on-a-chip (SoC), or multiple discrete packaged devices integrated on a printed circuit board (PCB). In general, chiplets provide better performance (e.g., lower power consumption, reduced latency, etc.) than discrete packaged devices, and chiplets provide greater production benefits than single die chips. These production benefits can include higher yields or reduced development costs and time.

Chiplet systems can include, for example, one or more application (or processor) chiplets and one or more support chiplets. Here, the distinction between application and support chiplets is simply a reference to the likely design scenarios for the chiplet system. Thus, for example, a synthetic vision chiplet system can include, by way of example only, an application chiplet to produce the synthetic vision output along with support chiplets, such as a memory controller chiplet, a sensor interface chiplet, or a communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets.

Chiplets also support the tight integration of IP blocks that can otherwise be difficult, such as those manufactured using different processing technologies or using different feature sizes (or utilizing different contact technologies or spacings). Thus, multiple ICs or IC assemblies, with different physical, electrical, or communication characteristics can be assembled in a modular manner to provide an assembly with various desired functionalities. Chiplet systems can also facilitate adaptation to suit needs of different larger systems into which the chiplet system will be incorporated. In an example, ICs or other assemblies can be optimized for the power, speed, or heat generation for a specific function —as can happen with sensors—can be integrated with other devices more easily than attempting to do so on a single die. Additionally, by reducing the overall size of the die, the yield for chiplets tends to be higher than that of more complex, single die devices.

FIG. 6A and FIG. 6B illustrate generally an example of a chiplet system, according to an embodiment. FIG. 6A is a representation of the chiplet system 602 mounted on a peripheral board 604, that can be connected to a broader computer system by a peripheral component interconnect express (PCIe), for example. The chiplet system 602 includes a package substrate 606, an interposer 608, and four chiplets, an application chiplet 610, a host interface chiplet 612, a memory controller chiplet 614, and a memory device chiplet 616. Other systems can include many additional chiplets to provide additional functionalities as will be apparent from the following discussion. The package of the chiplet system 602 is illustrated with a lid or cover 618, though other packaging techniques and structures for the chiplet system can be used. FIG. 6B is a block diagram labeling the components in the chiplet system for clarity.

The application chiplet 610 is illustrated as including a chiplet system NOC 620 to support a chiplet network 622 for inter-chiplet communications. In example embodiments the chiplet system NOC 620 can be included on the application chiplet 610. In an example, the first NOC 118 from the example of FIG. 1 can be defined in response to selected support chiplets (e.g., host interface chiplet 612, memory controller chiplet 614, and memory device chiplet 616) thus enabling a designer to select an appropriate number or chiplet network connections or switches for the chiplet system NOC 620. In an example, the chiplet system NOC 620 can be located on a separate chiplet, or within the interposer 608. In examples as discussed herein, the chiplet system NOC 620 implements a chiplet protocol interface (CPI) network.

In an example, the chiplet system 602 can include or comprise a portion of the first memory-compute node 104 or the first memory-compute device 112. That is, the various blocks or components of the first memory-compute device 112 can include chiplets that can be mounted on the peripheral board 604, the package substrate 606, and the interposer 608. The interface components of the first memory-compute device 112 can comprise, generally, the host interface chiplet 612, the memory and memory control-related components of the first memory-compute device 112 can comprise, generally, the memory controller chiplet 614, the various accelerator and processor components of the first memory-compute device 112 can comprise, generally, the application chiplet 610 or instances thereof, and so on.

The CPI interface, such as can be used for communication between or among chiplets in a system, is a packet-based network that supports virtual channels to enable a flexible and high-speed interaction between chiplets. CPI enables bridging from intra-chiplet networks to the chiplet network 622. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 622.

CPI can use a variety of different physical layers to transmit packets. The physical layer can include simple conductive connections, or can include drivers to increase the voltage, or otherwise facilitate transmitting the signals over longer distances. An example of one such a physical layer can include the Advanced Interface Bus (AIB), which in various examples, can be implemented in the interposer 608. AIB transmits and receives data using source synchronous data transfers with a forwarded clock. Packets are transferred across the AIB at single data rate (SDR) or dual data rate (DDR) with respect to the transmitted clock. Various channel widths are supported by AIB. The channel can be configured to have a symmetrical number of transmit (TX) and receive (RX) input/outputs (I/Os), or have a non-symmetrical number of transmitters and receivers (e.g., either all transmitters or all receivers). The channel can act as an AIB principal or subordinate depending on which chiplet provides the principal clock. AIB I/O cells support three clocking modes: asynchronous (i.e. non-clocked), SDR, and DDR. In various examples, the non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach, chiplet-to-chiplet interconnects, a parallel interface with clock rates that allow data transfer with minimal latency can be utilized. CPI includes elements to minimize both latency and energy consumption in these ultra-short reach chiplet interconnects.

For flow control, CPI employs a credit-based technique. A recipient, such as the application chiplet 610, provides a sender, such as the memory controller chiplet 614, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender allow transmitting of additional information.

The example of FIG. 6A includes a chiplet mesh network 624 that uses a direct, chiplet-to-chiplet technique without a need for the chiplet system NOC 620. The chiplet mesh network 624 can be implemented in CPI, or another chiplet-to-chiplet protocol. The chiplet mesh network 624 generally enables a pipeline of chiplets where one chiplet serves as the interface to the pipeline while other chiplets in the pipeline interface only with themselves.

Additionally, dedicated device interfaces, such as one or more industry standard memory interfaces (such as, for example, synchronous memory interfaces, such as DDR5, DDR6), can be used to connect a device to a chiplet. Connection of a chiplet system or individual chiplets to external devices (such as a larger system can be through a desired interface (for example, a PCIe interface). Such an external interface can be implemented, in an example, through the host interface chiplet 612, which in the depicted example, provides a PCIe interface external to chiplet system. Such dedicated chiplet interfaces 626 are generally employed when a convention or standard in the industry has converged on such an interface. The illustrated example of a Double Data Rate (DDR) interface connecting the memory controller chiplet 614 to a dynamic random access memory (DRAM) memory device chiplet 616 is just such an industry convention.

Of the variety of possible support chiplets, the memory controller chiplet 614 is likely present in the chiplet system due to the near omnipresent use of storage for computer processing as well as sophisticated state-of-the-art for memory devices. Thus, using memory device chiplets 616 and memory controller chiplets 614 produced by others gives chiplet system designers access to robust products by sophisticated producers. Generally, the memory controller chiplet 614 provides a memory device-specific interface to read, write, or erase data. Often, the memory controller chiplet 614 can provide additional features, such as error detection, error correction, maintenance operations, or atomic operator execution. For some types of memory, maintenance operations tend to be specific to the memory device chiplet 616, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh can be controlled by a host processor or of a memory controller at some times, and at other times controlled by the DRAM memory device, or by logic associated with one or more DRAM devices, such as an interface chip (in an example, a buffer).

Atomic operators are a data manipulation that, for example, can be performed by the memory controller chiplet 614. In other chiplet systems, the atomic operators can be performed by other chiplets. For example, an atomic operator of "increment" can be specified in a command by the application chiplet 610, the command including a memory address and possibly an increment value. Upon receiving the command, the memory controller chiplet 614 retrieves a number from the specified memory address, increments the number by the amount specified in the command, and stores the result. Upon a successful completion, the memory controller chiplet 614 provides an indication of the command success to the application chiplet 610. Atomic operators avoid transmitting the data across the chiplet mesh network 624, resulting in lower latency execution of such commands.

Atomic operators can be classified as built-in atomics or programmable (e.g., custom) atomics. Built-in atomics are a finite set of operations that are immutably implemented in hardware. Programmable atomics are small programs that can execute on a programmable atomic unit (PAU) (e.g., a custom atomic unit (CAU)) of the memory controller chiplet 614.

The memory device chiplet 616 can be, or include any combination of, volatile memory devices or non-volatile memories. Examples of volatile memory devices include, but are not limited to, random access memory (RAM)-such as DRAM) synchronous DRAM (SDRAM), graphics double data rate type 6 SDRAM (GDDR6 SDRAM), among others. Examples of non-volatile memory devices include, but are not limited to, negative-and-(NAND)-type flash memory, storage class memory (e.g., phase-change memory or memristor based technologies), ferroelectric RAM (FeRAM), among others. The illustrated example includes the memory device chiplet 616 as a chiplet, however, the device can reside elsewhere, such as in a different package on the peripheral board 604. For many applications, multiple memory device chiplets can be provided. In an example, these memory device chiplets can each implement one or multiple storage technologies, and may include integrated compute hosts. In an example, a memory chiplet can include, multiple stacked memory die of different technologies, for example one or more static random access memory (SRAM) devices stacked or otherwise in communication with one or more dynamic random access memory (DRAM) devices. In an example, the memory controller chiplet 614 can serve to coordinate operations between multiple memory chiplets in the chiplet system 602, for example, to use one or more memory chiplets in one or more levels of cache storage, and to use one or more additional memory chiplets as main memory. The chiplet system 602 can include multiple memory controller chiplet 614 instances, as can be used to provide memory control functionality for separate hosts, processors, sensors, networks, etc. A chiplet architecture, such as in the illustrated system, offers advantages in allowing adaptation to different memory storage technologies; and different memory interfaces, through updated chiplet configurations, such as without requiring redesign of the remainder of the system structure.

Figure 7:
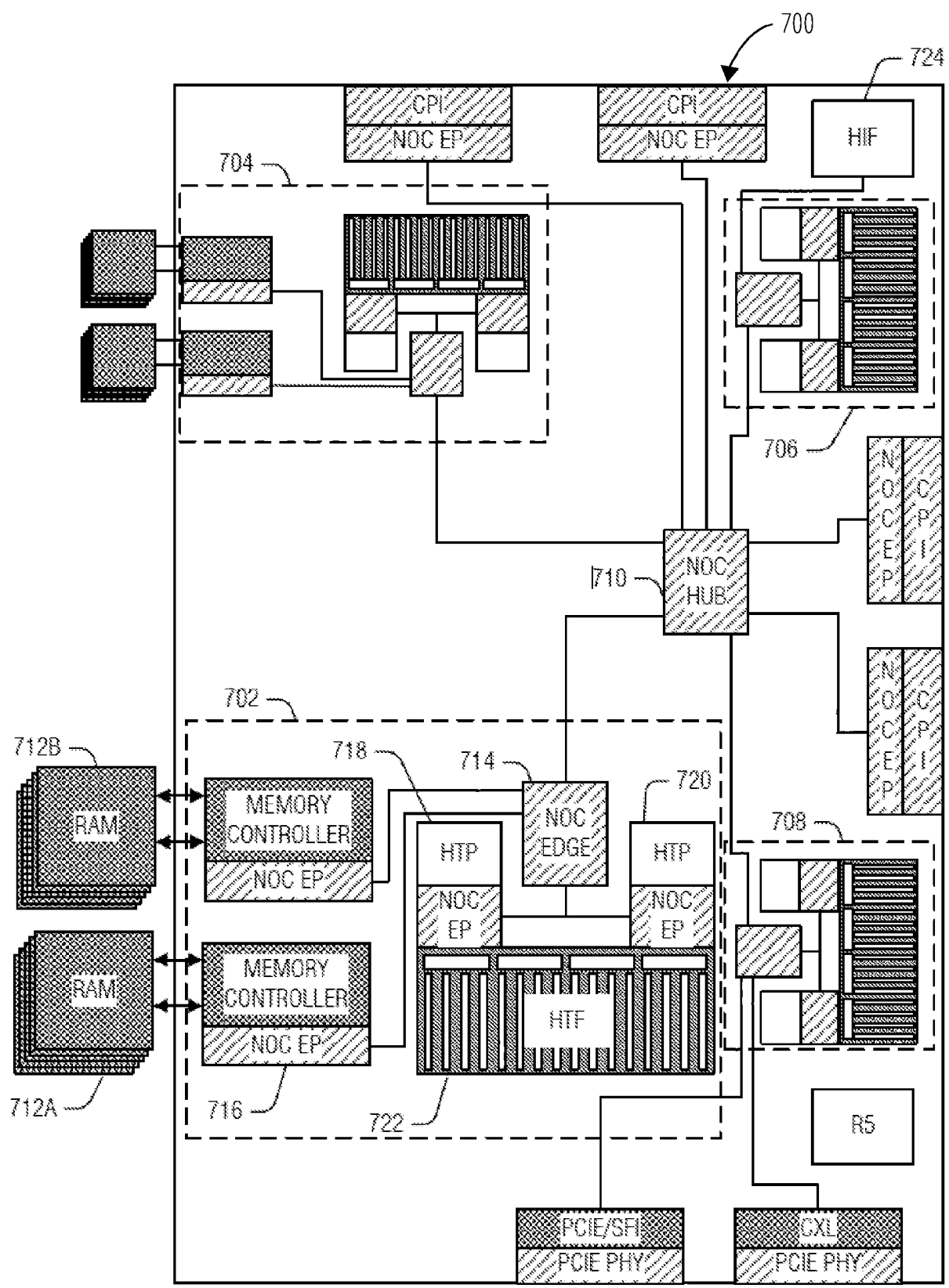
FIG. 7 illustrates generally an example of a chiplet-based implementation for a memory-compute device, according to an embodiment.

FIG. 7 illustrates generally an example of a chiplet-based implementation for a memory-compute device, according to an embodiment. The example includes an implementation with four compute-near-memory, or CNM, chiplets, and each of the CNM chiplets can include or comprise portions of the first memory-compute device 112 or the first memory-compute node 104 from the example of FIG. 1. The various portions can themselves include or comprise respective chiplets. The chiplet-based implementation can include or use CPI-based intra-system communications, as similarly discussed above in the example chiplet system 602 from FIG. 6A and FIG. 6B.

The example of FIG. 7 includes a first CNM package 700 comprising multiple chiplets. The first CNM package 700 includes a first chiplet 702, a second chiplet 704, a third chiplet 706, and a fourth chiplet 708 coupled to a CNM NOC hub 710. Each of the first through fourth chiplets can comprise instances of the same, or substantially the same, components or modules. For example, the chiplets can each include respective instances of an HTP accelerator, an HTF accelerator, and memory controllers for accessing internal or external memories.

In the example of FIG. 7, the first chiplet 702 includes a first NOC hub edge 714 coupled to the CNM NOC hub 710.

The other chiplets in the first CNM package 700 similarly include NOC hub edges or endpoints. The switches in the NOC hub edges facilitate intra-chiplet, or intra-chiplet-system, communications via the CNM NOC hub 710.

The first chiplet 702 can further include one or multiple memory controllers 716. The memory controllers 716 can correspond to respective different NOC endpoint switches interfaced with the first NOC hub edge 714. In an example, the memory controller 716 comprises the memory controller chiplet 614 or comprises the memory controller 130, or comprises the memory subsystem 200, or other memory-compute implementation. The memory controllers 716 can be coupled to respective different memory devices, for example including a first external memory module 712a or a second external memory module 712b. The external memory modules can include, e.g., GDDR6 memories that can be selectively accessed by the respective different chiplets in the system.

The first chiplet 702 can further include a first HTP chiplet 718 and second HTP chiplet 720, such as coupled to the first NOC hub edge 714 via respective different NOC endpoint switches. The HTP chiplets can correspond to HTP accelerators, such as the HTP 140 from the example of FIG. 1, or the HTP accelerator 400 from the example of FIG. 4. The HTP chiplets can communicate with the HTF chiplet 722. The HTF chiplet 722 can correspond to an HTF accelerator, such as the HTF 142 from the example of FIG. 1, or the HTF 500 from the example of FIG. 5.

The CNM NOC hub 710 can be coupled to NOC hub instances in other chiplets or other CNM packages by way of various interfaces and switches. For example, the CNM NOC hub 710 can be coupled to a CPI interface by way of multiple different NOC endpoints on the first CNM package 700. Each of the multiple different NOC endpoints can be coupled, for example, to a different node outside of the first CNM package 700. In an example, the CNM NOC hub 710 can be coupled to other peripherals, nodes, or devices using CTCPI or other, non-CPI protocols. For example, the first CNM package 700 can include a PCIe scale fabric interface (PCIE/SFI) or a CXL interface (CXL) configured to interface the first CNM package 700 with other devices. In an example, devices to which the first CNM package 700 is coupled using the various CPI, PCIe, CXL, or other fabric, can make up a common global address space.

In the example of FIG. 7, the first CNM package 700 includes a host interface 724 (HIF) and a host processor (R5). The host interface 724 can correspond to, for example, the HIF 120 from the example of FIG. 1. The host processor, or R5, can correspond to the internal host processor 122 from the example of FIG. 1. The host interface 724 can include a PCI interface for coupling the first CNM package 700 to other external devices or systems. In an example, work can be initiated on the first CNM package 700, or a tile cluster within the first CNM package 700, by the host interface 724. For example, the host interface 724 can be configured to command individual HTF tile clusters, such as among the various chiplets in the first CNM package 700, into and out of power/clock gate modes.

Figure 8:
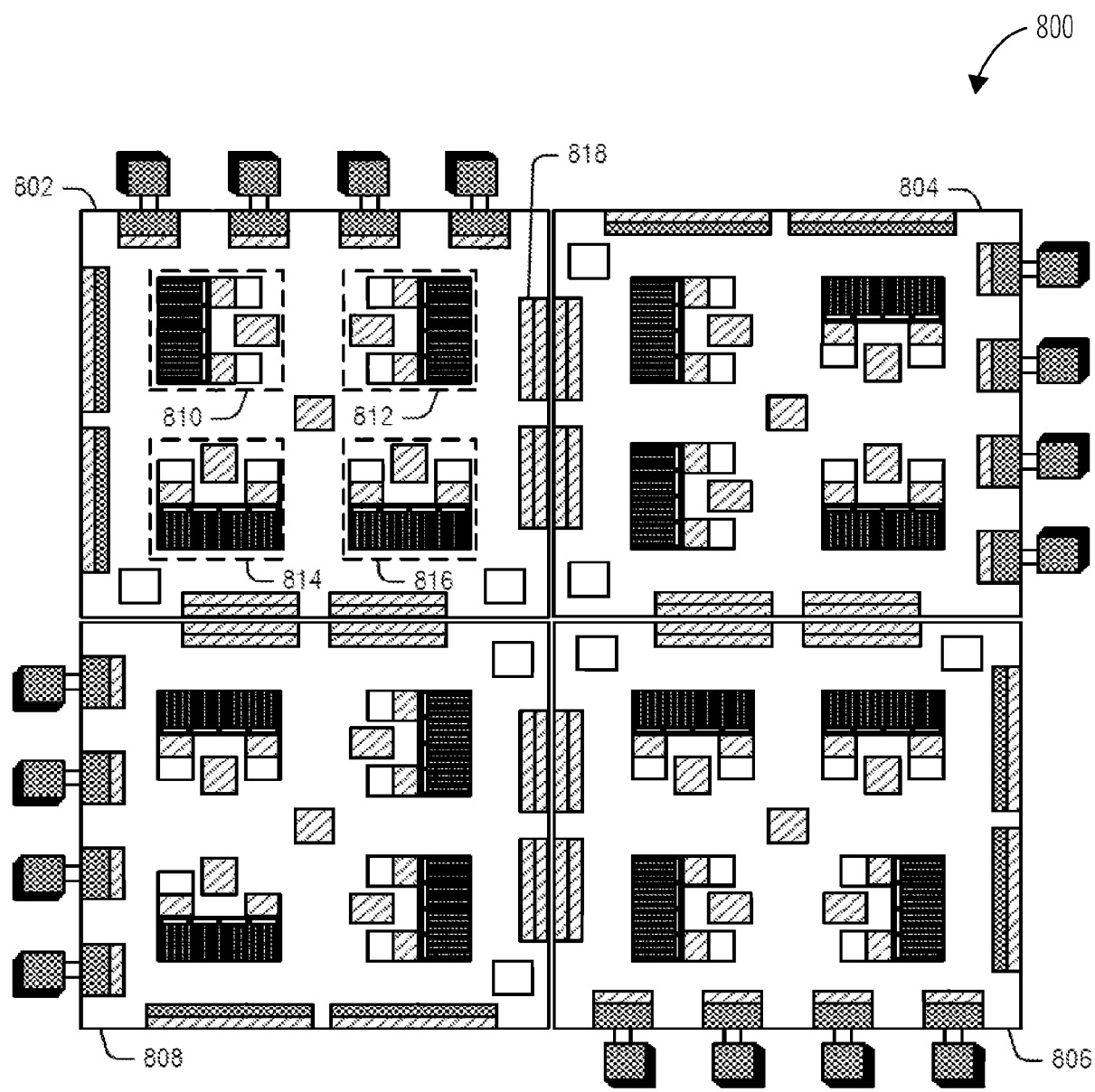
FIG. 8 illustrates an example tiling of memory-compute device chiplets, according to an embodiment.

FIG. 8 illustrates an example tiling of memory-compute devices, according to an embodiment. In FIG. 8, a tiled chiplet example 800 includes four instances of different compute-near-memory clusters of chiplets, where the clusters are coupled together. Each instance of a compute-near-memory chiplet can itself include one or more constituent chiplets (e.g., host processor chiplets, memory device chiplets, interface chiplets, and so on).

The tiled chiplet example 800 includes, as one or multiple of its compute-near-memory (CNM) clusters, instances of the first CNM package 700 from the example of FIG. 7. For example, the tiled chiplet example 800 can include a first CNM cluster 802 that includes a first chiplet 810 (e.g., corresponding to the first chiplet 702), a second chiplet 812 (e.g., corresponding to the second chiplet 704), a third chiplet 814 (e.g., corresponding to the third chiplet 706), and a fourth chiplet 816 (e.g., corresponding to the fourth chiplet 708). The chiplets in the first CNM cluster 802 can be coupled to a common NOC hub, which in turn can be coupled to a NOC hub in an adjacent cluster or clusters (e.g., in a second CNM cluster 804 or a fourth CNM cluster 808).

In the example of FIG. 8, the tiled chiplet example 800 includes the first CNM cluster 802, the second CNM cluster 804, a third CNM cluster 806, and the fourth CNM cluster 808. The various different CNM chiplets can be configured in a common address space such that the chiplets can allocate and share resources across the different tiles. In an example, the chiplets in the cluster can communicate with each other. For example, the first CNM cluster 802 can be communicatively coupled to the second CNM cluster 804 via an inter-chiplet CPI interface 818, and the first CNM cluster 802 can be communicatively coupled to the fourth CNM cluster 808 via another or the same CPI interface. The second CNM cluster 804 can be communicatively coupled to the third CNM cluster 806 via the same or other CPI interface, and so on.

In an example, one of the compute-near-memory chiplets in the tiled chiplet example 800 can include a host interface (e.g., corresponding to the host interface 724 from the example of FIG. 7) that is responsible for workload balancing across the tiled chiplet example 800. The host interface can facilitate access to host-based command request queues and response queues, such as from outside of the tiled chiplet example 800. The host interface can dispatch new threads of execution using hybrid threading processors and the hybrid threading fabric in one or more of the compute-near-memory chiplets in the tiled chiplet example 800.

Figure 9:
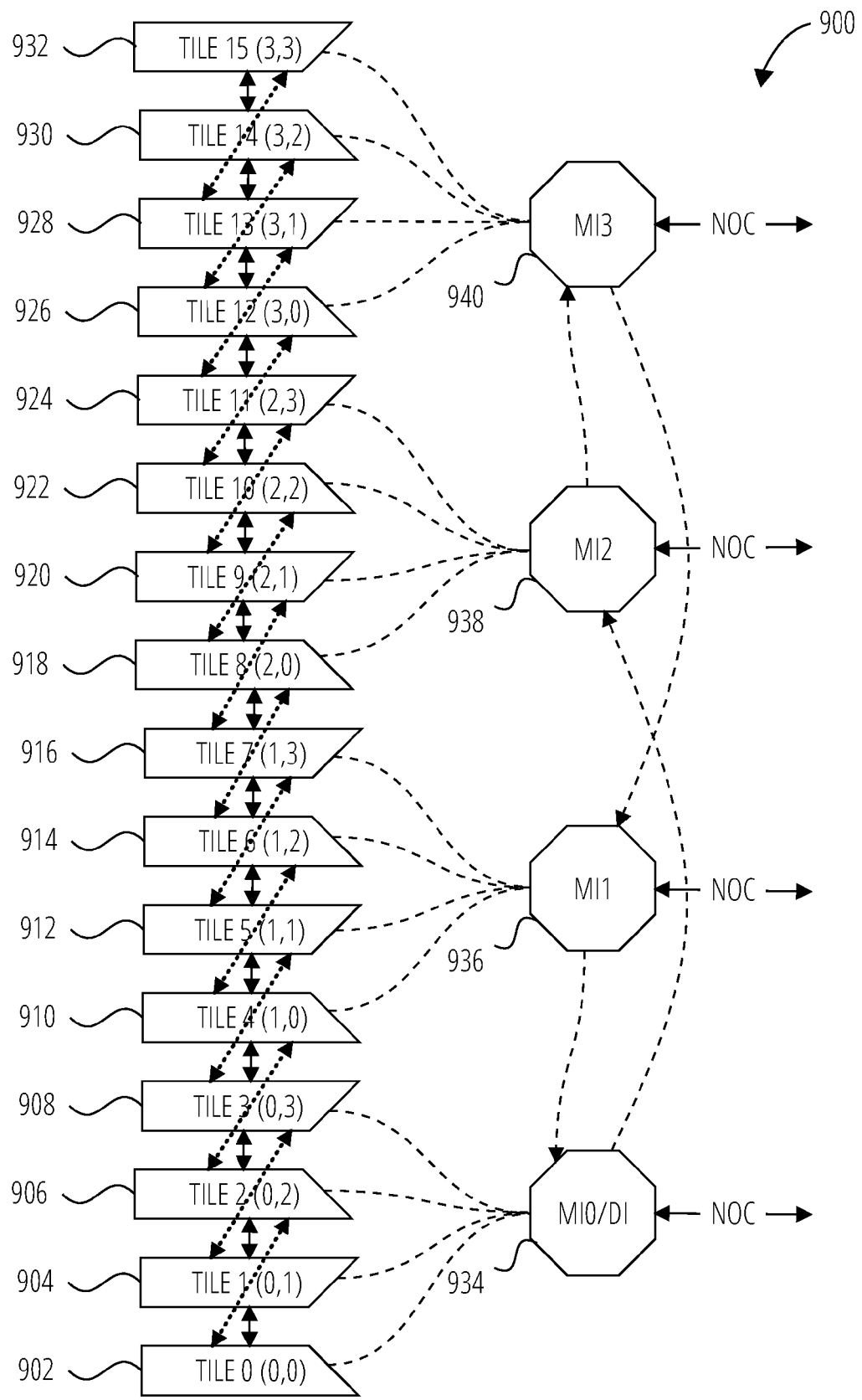
FIG. 9 illustrates generally an example of a first tile system comprising a portion of a hybrid threading fabric.

FIG. 9 illustrates generally an example of a first tile system 900 comprising a portion of a hybrid threading fabric. In an example, the first tile system 900 comprises a portion of the HTF 142, or comprises the HTF 500 from the example of FIG. 5. The example of FIG. 9 includes a 1×16 array of tiles (labeled Tile 0 through Tile 15) that comprises a portion of a reconfigurable compute array. Each of the tiles can comprise a respective different instance of the example tile 504 from FIG. 5. That is, each tile can include its own respective memory or memories, compute element or functional element, registers, and inputs and outputs providing connectivity to other tiles in the system, among other components.

In the example of FIG. 9, the several tiles in the first tile system 900 are grouped into four groups of four tiles each, and each group is associated with a memory interface and/or a dispatch interface. For example, a first group of tiles includes a first tile 902, a second tile 904, a third tile 906, and a fourth tile 908 coupled to a first memory interface 934. The first memory interface 934 can be coupled to a NOC, such as the NOC interface 416, to provide communication between tiles in the first group and other tiles, other tile systems, or other system resources. In other tile systems, the tiles can be differently grouped or configured, such as to include fewer or more than four tiles per group.

Each tile in the first tile system 900 can have associated notional coordinates that indicates the particular tile and the memory interface with which it communicates. For example, the first tile 902 can have coordinates (0,0) to indicate that the first tile 902 is associated with the first memory interface 934 Ml0 and to indicate that the first tile 902 is the first tile (i.e., Tile 0) in the first tile system 900. The second tile 904 can have coordinates (0,1) to indicate that the second tile 904 is associated with the first memory interface 934 Ml0 and to indicate that the second tile 904 is the second tile (i.e., Tile 1) in the first tile system 900.

A second group of tiles in the first tile system 900 includes a fifth tile 910 (Tile 4), sixth tile 912 (Tile 5), seventh tile 914 (Tile 6), and eighth tile 916 (Tile 7) coupled to a second memory interface 936 (Ml1). A third group of tiles in the first tile system 900 includes a ninth tile 918 (Tile 8), tenth tile 920 (Tile 9), eleventh tile 922 (Tile 10), and twelfth tile 924 (Tile 11) coupled to a third memory interface 938 (MI2). A fourth group of tiles in the first tile system 900 includes a thirteenth tile 926 (Tile 12), fourteenth tile 928 (Tile 13), fifteenth tile 930 (Tile 14), and sixteenth tile 932 (Tile 15) coupled to a fourth memory interface 940 (MI3). The notional coordinates for the various tiles Tile 4 through Tile 15 are illustrated in the example of FIG. 9. Each of the different memory interfaces, such as the first memory interface 934, the second memory interface 936, third memory interface 938, or fourth memory interface 940 can be coupled to the same or different NOC.

In an example, each memory interface can be configured to receive instructions from the NOC and, in response, initiate or participate in one or more synchronous flows using tiles associated with the interface. In an example, a particular memory interface can participate in work using any of the tiles in the fabric or in the first tile system 900. It can be advantageous for a particular memory interface to use tiles to which it is directly coupled, such as due to increased bandwidth and lower latency. However, the asynchronous fabric can communicatively couple the different memory interfaces, and therefore any one of the memory interfaces can send or receive information to or from any of the tiles in the first tile system 900. In the example of FIG. 9, the first memory interface 934 comprises a dispatch interface that is configured to receive synchronous flow instructions and initiate threads using one or more of the groups of tiles in the first tile system 900.

The example of FIG. 9 illustrates the synchronous and asynchronous fabrics that couple the various tiles and memory interfaces. In the example, solid lines that couple pairs of tiles indicate first portions of the synchronous fabric. Dashed bolded lines that couple other pairs of tiles indicate second portions of the synchronous fabric. Dashed unbolded lines that couple the various tiles to the memory interfaces indicate portions of the asynchronous fabric. Arrowheads in the illustration indicate a direction of data flow and can, where indicated, include bidirectional communication. For ease of illustration, each line may represent one or multiple different unidirectional or bidirectional data communication channels.

In an example, the synchronous fabric can include a passthrough channel that extends through or across at least one tile to communicatively couple two other tiles. In the illustrated example, the synchronous fabric can include a bidirectional communication channel that directly couples the first tile 902 to the second tile 904, as indicated by the solid line coupling the two tiles. The synchronous fabric can further include a bidirectional communication channel that directly couples the second tile 904 to the third tile 906, as indicated by the solid line coupling the two tiles. The synchronous fabric can further include a bidirectional communication channel that couples the first tile 902 to the third tile 906, such as using a bidirectional passthrough channel in or through the second tile 904, as indicated by the dashed bolded line that extends across the second tile 904 and couples the first tile 902 to the third tile 906. In this manner, the first tile 902 is coupled to each of an adjacent tile (i.e., the second tile 904) and to a tile that is one-hop away (i.e., the third tile 906, which is one "hop" or one device space or tile position away from the first tile 902) using the synchronous fabric, such as can be used for synchronous data flows executed by the first tile system 900.

The various tiles in the first tile system 900 have different connectivity characteristics. For example, each of the third through fourteenth tiles (Tile 2 through Tile 13) has full or maximum connectivity to its neighbors via the synchronous fabric, each of the second and fifteenth tiles (Tile 1 and Tile 14) has intermediate connectivity to its neighbors, and each of the first and sixteenth tiles (Tile 0 and Tile 15) has minimal connectivity via the synchronous fabric.

Tile 0 is considered to have minimal connectivity because it has one adjacent neighbor rather than two, and has one neighbor that is one hop away rather than two such neighbors. For example, Tile 0 is coupled to its one adjacent tile, Tile 1, via a direct bus in the synchronous fabric. Tile 0 is further coupled to one tile that is one hop away, Tile 2, via a passthrough channel or bus in Tile 1.

Tile 1 is considered to have intermediate connectivity because it has two adjacent neighbor tiles (e.g., Tile 0 and Tile 2), and has one neighbor that is one hop away rather than two such neighbors. For example, Tile 1 is coupled to its adjacent tiles, Tile 0 and Tile 2, via respective busses in the synchronous fabric. Tile 1 is further coupled to one tile that is one hop away, Tile 3, via a passthrough channel or bus in Tile 2.

Tile 2 is considered to have maximum or full connectivity because it has two adjacent neighbor tiles (e.g., Tile 0 and Tile 2), and has two neighbors that are one hop away. For example, Tile 2 is coupled to its adjacent tiles, Tile 1 and Tile 3, via respective busses in the synchronous fabric. Tile 2 is further coupled to tiles that are one hop away in respective different directions. For example, Tile 2 is coupled to Tile 0 via a passthrough channel or bus in Tile 1, and Tile 2 is further coupled to Tile 4 via a passthrough channel or bus in Tile 3.

In the example of FIG. 9, the various tiles comprising the first tile system 900 are illustrated conceptually or notionally as being arranged in one column. A physical implementation or layout of the various tiles 902-932 can be similarly or differently arranged. For example, the tiles can be physically such that each tile (or compute resources or other resources) in the first tile system 900 is substantially equally spaced from its neighbors. That is, path lengths between adjacent pairs of tiles can be equidistant. In an example, path lengths between tiles that are one-hop apart can similarly be equidistant. In an example, tiles can be arranged such that path lengths between tiles that are adjacent and between tiles that are one-hop apart can be substantially equidistant. When tiles are arranged to be physically equidistant or substantially equally spaced, other flow control registers can be unnecessary to control timing. In other words, when physical distances between coupled tiles are substantially the same, then lengths of data paths that extend between adjacent or neighboring tile pairs can be consistent. Consistent data path lengths can help reduce or eliminate a need for other or intermediate data flow control mechanisms and can help simplify kernel mapping to the tile-based resources.

In the example of FIG. 9, each of the various tiles is coupled to one of the memory interfaces using the asynchronous fabric, and each of the memory interfaces is further coupled with the other memory interfaces using the asynchronous fabric. For example, the first group of tiles Tile 0 through Tile 3 is coupled to the first memory interface 934 using respective asynchronous fabric channels, the second group of tiles Tile 4 through Tile 7 is coupled to the second memory interface 936 using respective asynchronous fabric channels, the third group of tiles Tile 8 through Tile 11 is coupled to the third memory interface 938 using respective asynchronous fabric channels, and the fourth group of tiles Tile 12 through Tile 15 is coupled to the fourth memory interface 940 using respective asynchronous fabric channels.

The memory interfaces in the first tile system 900 can be coupled using unidirectional communication channels that provide a communication loop among the interfaces. For example, using the asynchronous fabric, the first memory interface 934 can be configured to communicate information to the third memory interface 938, the third memory interface 938 can be configured to communicate information to the fourth memory interface 940, the fourth memory interface 940 can be configured to communicate information to the second memory interface 936, and the second memory interface 936 can be configured to communicate information to the first memory interface 934. The memory interfaces can optionally be differently coupled, such as using bidirectional channels of the asynchronous fabric, or can be coupled in other than a loop configuration. Each of the memory interfaces can be respectively coupled to a NOC using a NOC bus or portion of a NOC fabric.

In an example, the respective busses or data paths between pairs of memory interfaces in the first tile system 900 can be the same or approximately the same length. When physical distances between the interfaces are substantially equal, lengths of data paths that extend between memory interface pairs can be more consistent and, in turn, can help reduce or eliminate a need for other or intermediate data flow control registers.

Figure 10:
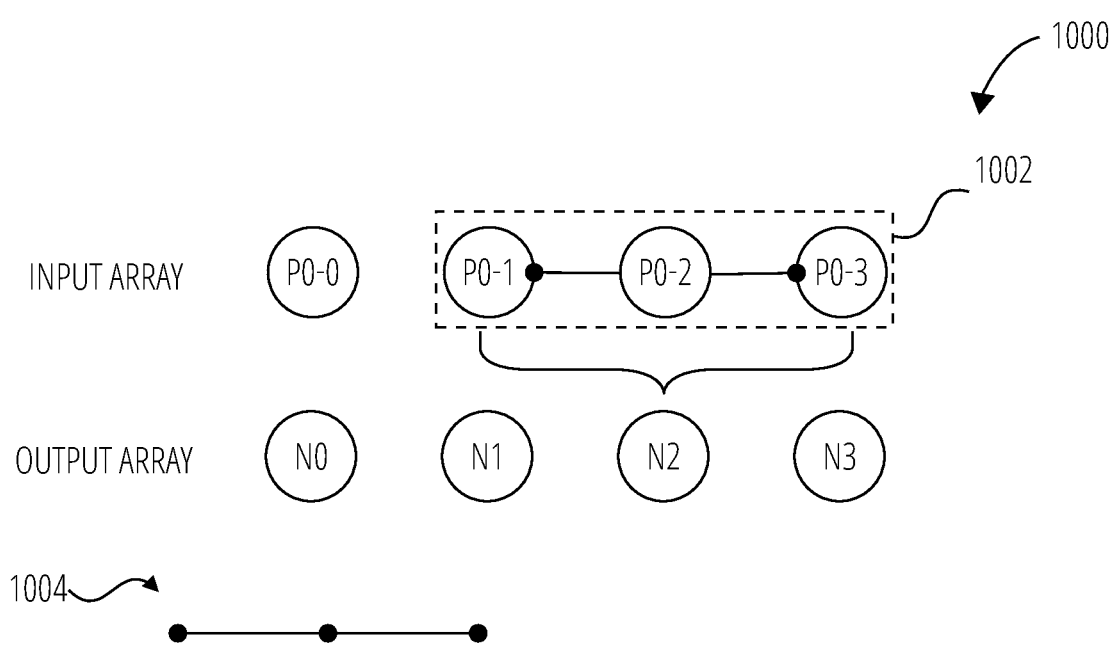
FIG. 10 illustrates generally a first stencil example that shows a graphical example of a stencil operation.

FIG. 10 illustrates generally a first stencil example 1000 that shows a graphical example of a stencil operation. The first stencil example 1000 includes a representation of an input array of elements or data, such as can be stored in a main system memory or in a buffer. The different memory locations in the input array are designated P0-0, P0-1, P0-2, and P0-3. Each location can correspond to a different data object, packet, vector, or other information. The first stencil example 1000 further includes a representation of an output array of elements or data, such as can be stored in a different memory or buffer than the elements of the input array. The different locations in the output array are designated N0, N1, N2, and N3. The sizes of the input and output arrays can be arbitrarily small or large. For ease of illustration, the example in FIG. 10 includes four-element arrays.

The first stencil example 1000 includes a first stencil 1004. In an example, the first stencil 1004 defines a neighborhood or group of elements that can be considered or used together as inputs to a stencil operation. In the example of FIG. 10, the first stencil 1004 indicates that the stencil comprises or uses three consecutive elements of a linear input array. The first stencil 1004 can be mapped to or used with an input array, such as the particular input array of FIG. 10, to define a first neighborhood 1002 of elements.

In an example, a stencil can be referenced to or by an anchor element. In symmetrical stencils, the anchor element can be a central element from which the neighborhood of elements corresponding to the stencil can be determined or defined. In asymmetrical stencils, the anchor element can be a corner element or other reference element from which the other elements or neighborhood of the stencil can be found. The particular element to use as an anchor element can be specified, can be arbitrary, or can be otherwise chosen by a programmer or algorithm.

In an example, performing the stencil operation or operations defined by the first stencil 1004 can include reading each respective value corresponding to the memory locations defined by the stencil, operating on the values (e.g., together, such as using a functional unit to perform addition, multiplication, or other operations), and providing a stencil operation result. For example, performing the stencil operation defined by the first stencil 1004 can include reading each of the values from the first neighborhood 1002, multiplying each value by a constant, summing the products, and providing a stencil operation result. In an example, a result of the stencil operation corresponding to the first stencil 1004 and the first neighborhood 1002 can be stored in the output array, such as at output array location N2. Respective stencil operation results for different inputs can be stored at corresponding respective locations in the output array.

Figure 11:
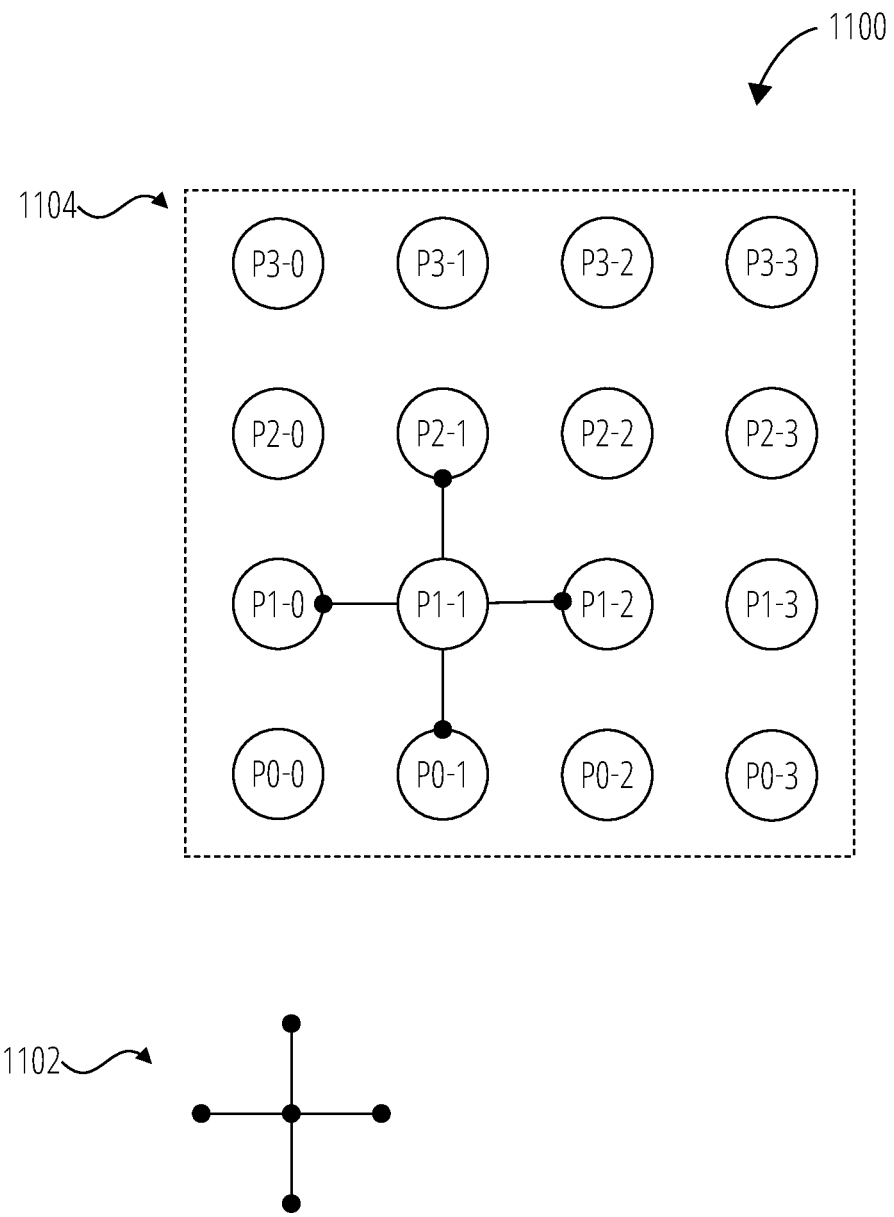
FIG. 11 illustrates generally a second stencil example that shows a graphical example of a stencil operation.

FIG. 11 illustrates generally a second stencil example 1100 that shows a graphical example of a stencil operation. The second stencil example 1100 includes a second stencil 1102 that defines a neighborhood or group of elements that can be considered or used together as inputs to a stencil operation. In the example of FIG. 11, the second stencil 1102 indicates that the stencil comprises five elements: an anchor element (e.g., a central element or notional origin of the stencil), and the nearest neighbors to the anchor element in each of four different directions in the grid.

The second stencil example 1100 includes an input array or input data array 1104. The elements of the input data array 1104 are arranged in a 4×4 grid that includes sixteen elements. A first row of the input data array 1104 includes elements P0-0, P0-1, P0-2, and P0-3, a second row of the input data array 1104 includes elements P1-0, P1-1, P1-2, and P1-3, and so on. As in the example of FIG. 10, the input array can be made arbitrarily large or small. The sixteen element array is provided for purposes of illustration. In an example, the input data array 1104 represents information stored in a main memory of the CNM system 102 of FIG. 1. In an example that includes the HTF 142 from FIG. 1, the input data array 1104 can represent information stored in other than a local tile memory of a tile-based memory-compute device of the first memory-compute node 104.

In an example, performing the stencil operation defined by the second stencil 1102 can include using compute resources (e.g., tile-based or node-based resources) to read each of five different elements from the input data array 1104, where the five elements are selected according to the second stencil 1102. The stencil operation can provide a stencil operation result for each of multiple iterations or positions of the second stencil 1102 with respect to the input data array 1104. For example, neglecting boundary elements, the stencil operation can be performed when the stencil is anchored at any one of element P1-1, element P1-2, element P2-1, or element P2-2. The stencil operation performed when the stencil is anchored at element P1-1 includes or uses a neighborhood of elements that includes P0-1, P1-0, P1-1, P1-2, and P2-1. The stencil operation performed when the stencil is anchored at element P1-2 includes or uses a neighborhood of elements that includes P0-2, P1-1, P1-2, P1-3, and P2-2, and so forth. In other words, the stencil can be used to traverse the memory array, e.g., in an ordered manner, to perform operations using every available set of five data elements that can satisfy the conditions or dimensions of the second stencil 1102.

In an example, each input array memory element or location can be read once and then used by as many different stencil operations as may be required by a particular thread. One solution can include reading consecutive columns of information from the input array and performing stencil operations when a sufficient number of columns of information are available, as determined by the particular stencil. In the example of FIG. 11, for example, elements can be read from the leftmost column (e.g., elements corresponding to P0-0 through P3-0), then from the adjacent column (e.g., elements corresponding to P0-1 through P3-1), and then from the next column (e.g., elements corresponding to P0-2 through P3-2). When three columns of information are available, then the operations defined by the second stencil 1102 can be performed. The efficiency of such a technique can be low when the height of the columns exceeds that of the stencil. That is, memory elements beyond those that may be required by a particular stencil may be read, which can waste time and power.

In an example, another solution can include reading partial columns of information from the input array, buffering the information, and performing stencil operations using the buffered information. The buffered information can be selectively popped or discarded as stencil operations progress through an array of input data. In this manner, the buffered information can be quickly accessed one or multiple times depending on the particular stencil. The number of locations in the buffer can be fixed or dynamic, or can depend on a size of the stencil. In the example of FIG. 11 and the second stencil 1102, the number of locations in the buffer can be defined by the maximum height (e.g., three values) and the maximum width (e.g., three values) of the second stencil 1102.

Figure 12:
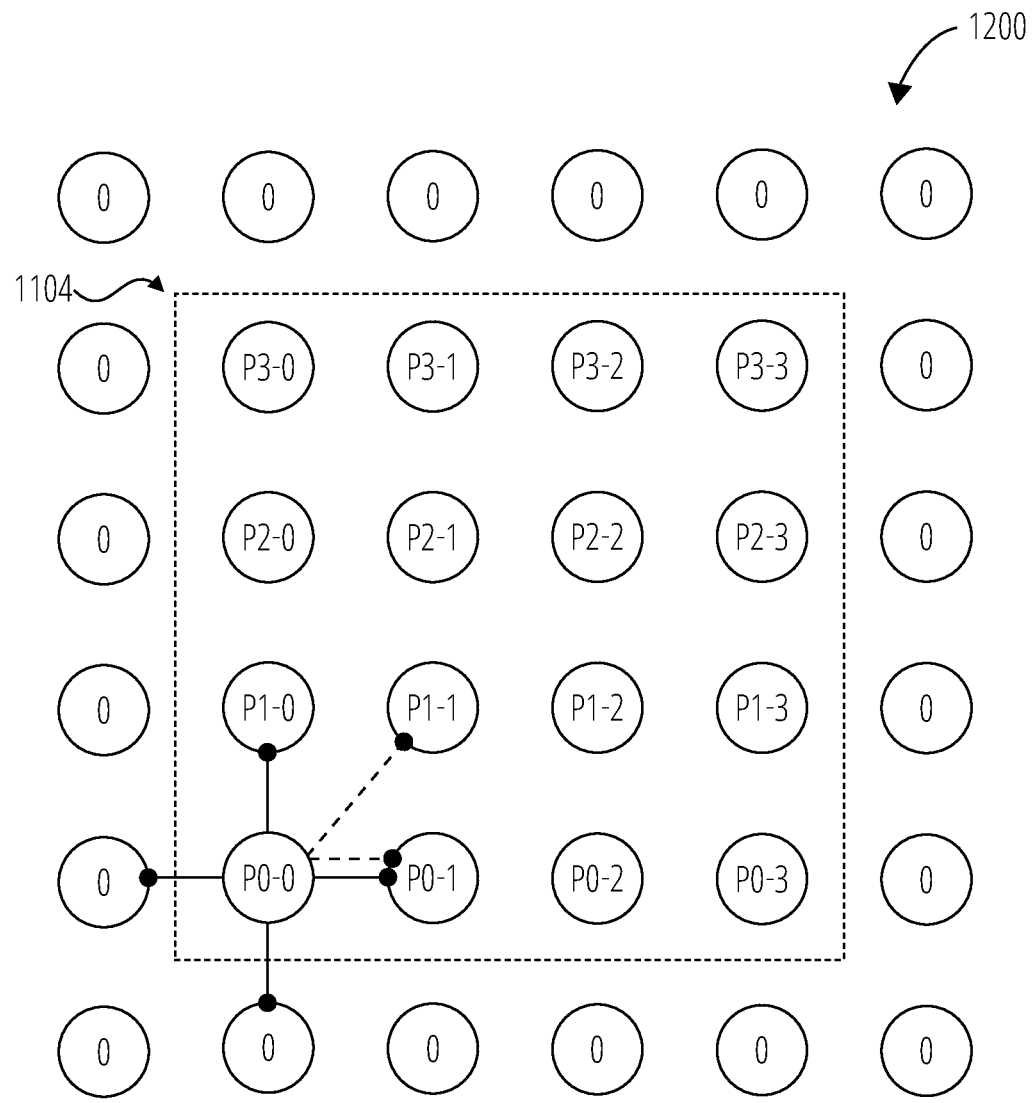
FIG. 12 illustrates generally a stencil example and stencil boundary handling example.
Figure 12:
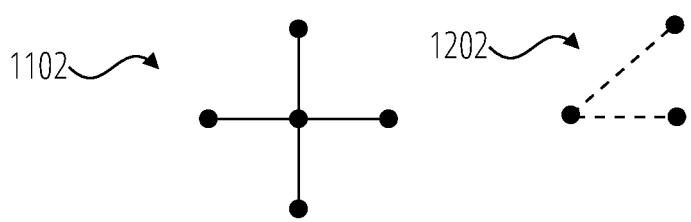

FIG. 12 illustrates generally a third stencil example 1200 that shows a graphical example of a stencil operation and stencil boundary handling technique. The third stencil example 1200 includes the same input data array 1104 as in the second stencil example 1100 from FIG. 11, and includes the second stencil 1102. As similarly explained above, the input data array 1104 can comprise a portion of a main memory or tile-external memory that can be accessed by tile-based resources.

The third stencil example 1200 includes a third stencil 1202 that defines a different neighborhood of elements than is defined by the second stencil 1102. In the example of FIG. 12, the third stencil 1202 is differently dimensioned than the second stencil 1102, that is, the third stencil 1202 refers to elements from two rows and two columns, while the second stencil 1102 refers to elements from three rows and three columns in the input data array 1104.

In the third stencil example 1200, a size of the input data array 1104 can be extended (e.g., in each of top, bottom, right, and left directions) to allow references to memory locations outside of the input data array 1104 and thereby permit stencil operations that include or use edge elements of the input data array 1104. For example, the second stencil 1102 can be anchored at a corner element of the input data array 1104 (e.g., P0-0) in the third stencil example 1200, and two of the stencil points (e.g., left and bottom) can be satisfied by, e.g., null or default information provided in corresponding ones of the extended memory locations.

In an example, stencil operations such as defined by the second stencil 1102 or the third stencil 1202 can be facilitated by retrieving some but not all of the elements of the input data array 1104, populating a buffer to establish a first buffer occupancy, and then performing one or more stencil operations using the information in the buffer during the first buffer occupancy. Stencil operation results corresponding to the first buffer occupancy can be written to a different memory. Stencil operations can be further facilitated by iteratively purging some information from the buffer, retrieving new or additional information from the input data array 1104 to establish a second buffer occupancy, and then performing the same one or more stencil operations using the information in the buffer during the second buffer occupancy. Stencil operation results corresponding to the second buffer occupancy can be written to the same or further different memory.

Figure 13:
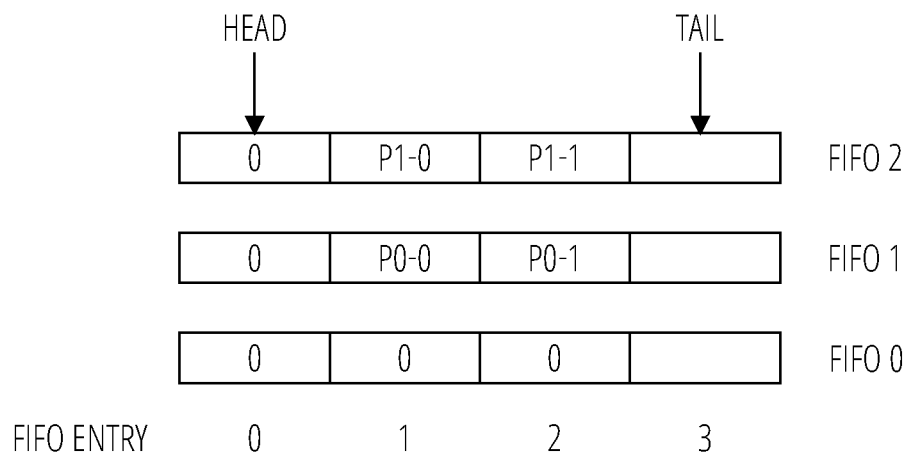
FIG. 13 illustrates generally an example of multiple buffers storing information for stencil operations and having a first buffer occupancy.

FIG. 13 illustrates generally an example of multiple buffers that can be used to store information for stencil operations. The example of FIG. 13 shows the buffers with a first buffer occupancy. Generally, a buffer occupancy refers to a state or content of one or more buffers, or buffer locations, at a particular time. A buffer occupancy can be the same or different at multiple different times. The example of FIG. 13 can include multiple buffers, such as first-in-first-out (FIFO) buffers. The FIFO buffers can comprise, for example, a tile-local memory or portion of a tile memory, such as in the HTF 142 of the CNM system 102.

A number or size of the FIFO buffers used for particular stencil operations can be set or defined based on characteristics of one or more stencils. For example, a configuration of the FIFO buffers can be determined based on a width or height of a grid that corresponds to memory locations defined by, e.g., one stencil to be used with data stored in the FIFO buffers. The second stencil 1102, for example, can refer to memory locations from three different rows and three different columns in an input grid or input array of data. Accordingly, a minimum size or configuration of FIFO buffers to accommodate elements that can be processed according to the second stencil 1102 can receive nine different elements (e.g., three elements from each of three different rows). The third stencil 1202, for example, can refer to memory locations from two different rows and two different columns in the same or different input grid or input array of data. Accordingly, a minimum size or configuration of FIFO buffers to accommodate elements that can be processed according to the third stencil 1202 can receive four different elements (e.g., two elements from each of two different rows).

In an example that includes multiple stencils, such as in FIG. 13, a number or size of the FIFO buffers can be set or defined based on largest dimensions of all of the stencils when considered together. For example, the minimum FIFO buffer size for each of the second stencil 1102 and the third stencil 1202 can be different (e.g., four elements and nine elements, respectively). If stencil operations according to each of the second stencil 1102 and the third stencil 1202 are to be performed substantially concurrently or with minimal latency, then the FIFO buffers can be sized according to the greatest width and height of grid locations defined by the different stencils. In this example, the FIFO buffers can be sized to accommodate the second stencil 1102 (e.g., such that one operation defined by the second stencil 1102 can be performed during a first buffer occupancy) and, when sized accordingly, the same FIFO buffers can accommodate multiple operations as-defined by the third stencil 1202 using the same buffer occupancy.

To further illustrate the example, FIG. 13 includes a first FIFO buffer (FIFO 0), a second FIFO buffer (FIFO 1), and a third FIFO buffer (FIFO 2). The buffers can be populated using, e.g., information from the first three columns (e.g., columns 0 through 2) of the first three rows (e.g., rows 0 through 2) of an input data array, such as that illustrated in the example of FIG. 12. In the example of FIG. 13, an initial occupancy of the FIFO buffers can include the following. FIFO 0 can include values corresponding to the first three columns of the bottom or extended row of the memory array. In this example, the bottom row of the memory array can include null values from the extended memory locations. FIFO 1 can include values corresponding to the first three columns of the first row of the memory array. In this example, the first row of the memory array includes a null value from the left extended memory location, and locations P0-0 and P0-1 from the input data array 1104. FIFO 2 can include values corresponding to the first three columns of the second row of the memory array. In this example, the second row of the memory array includes a null value from the left extended memory location, and locations P1-0 and P1-1 from the input data array 1104. In other words, the initial occupancy of the FIFO buffers FIFO 0, FIFO 1, and FIFO 2 can be used to perform one iteration of a stencil operation defined by the second stencil 1102 (e.g., using anchor element P0-0, left and bottom null elements, P1-0, and P0-1). A result of the operation can be stored in a first output array.

The same initial occupancy of the FIFO buffers can optionally be used to perform one or more iterations of a stencil operation defined by the third stencil 1202. One iteration can include, for example, elements P0-0, P1-1 and P0-1. In an example, a second iteration can include the null value from FIFO 1 entry 0, and elements P1-0 and P0-0. A third iteration can include the null values from FIFO 0 entries 0 and 1, and element P0-0. A fourth iteration can include the null values from FIFO 0 entries 1 and 2, and element P0-1. Results of the four different operations can be stored in respective locations in a second output array.

In an example, an occupancy of the FIFO buffers from FIG. 13 can be changed to accommodate further stencil operations according to the second stencil 1102. In other words, some buffered data can be replaced with different data (e.g., from other locations in input data array 1104) and then the second stencil 1102 can be used for further operations.

Figure 14:
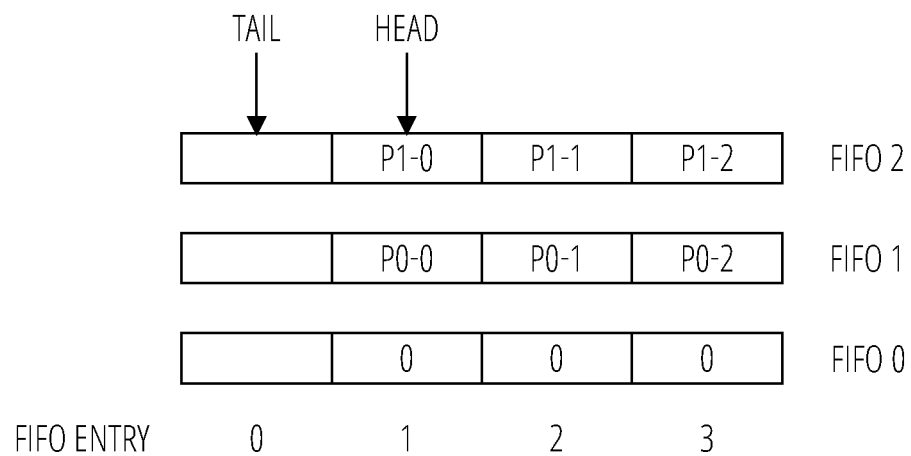
FIG. 14 illustrates generally an example of multiple buffers storing information for stencil operations and having a second buffer occupancy.

FIG. 14 illustrates generally the same FIFO buffers from the example of FIG. 13 but with a different occupancy. For example, when stencil operations according to the first buffer occupancy are completed, then the head entry of each of the different FIFO buffers can be popped, and information from the next or subsequent column in the input data array 1104 can be pushed into respective locations in the buffers. In the example of FIG. 14, a head pointer for the buffers can move from pointing to FIFO column 0 to point to FIFO column 1, and data from the third column of the input data array 1104 can be pushed into the buffers at FIFO column 3. A new or second buffer occupancy can thus be provided.

In the example of FIG. 14, the second occupancy of the FIFO buffers can include the following. FIFO 0 can include values corresponding to columns 1, 2, and 3 of the bottom or extended row of the memory array. In this example, the bottom row of the memory array can include null values from the extended memory locations. FIFO 1 can include values corresponding to columns 1, 2, and 3 of the first row of the memory array. In this example, the first row of the memory array includes elements P0-0, P0-1, and P0-2 from the input data array 1104. FIFO 2 can include values corresponding to columns 1, 2, and 3 of the second row of the memory array.

In this example, the second row of the memory array includes elements P1-0, P1-1, and P1-2 from the input data array 1104. The second occupancy of the FIFO buffers FIFO 0, FIFO 1, and FIFO 2 can be used to perform a second iteration of the stencil operation defined by the second stencil 1102 (e.g., using anchor element P0-1, P0-0, P1-1, P0-2, and a bottom null element). A result of the operation can be stored in the first output array. The second occupancy of the FIFO buffers can similarly be used to perform one or up to four iterations of a stencil operation defined by the third stencil 1202. Results of the four different operations can be stored in respective locations in the second output array.

Figure 15:
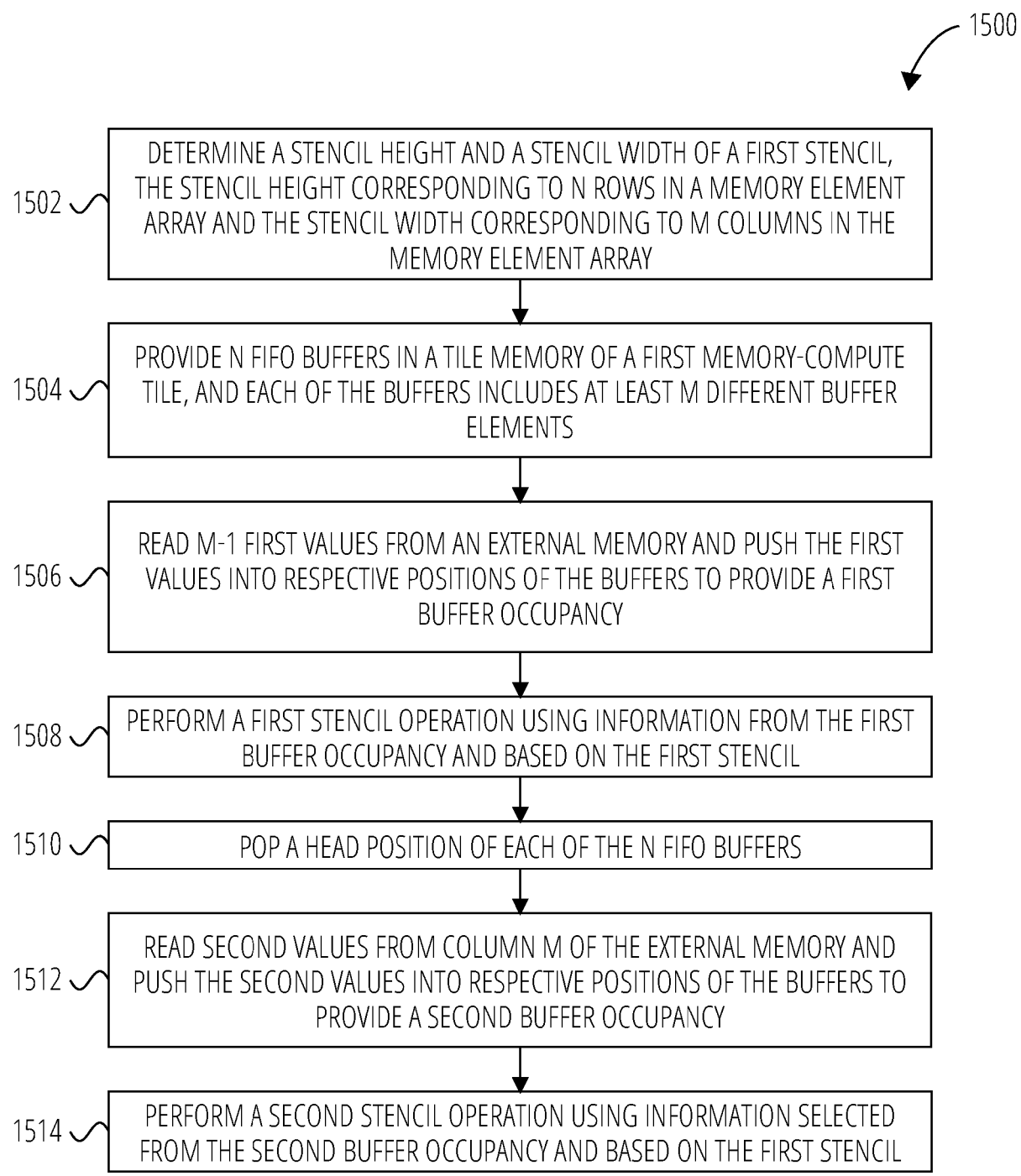
FIG. 15 illustrates generally an example of a first method that can include or use stencil data for operations in a compute-near-memory system.

FIG. 15 illustrates generally an example of a first method 1500 that can include or use stencil data for operations in the CNM system 102. The first method 1500 can include receiving a first stencil definition for a first stencil. The first stencil definition can include, for example, shape or configuration information about a stencil. The shape or configuration information can be used to determine which particular data from an input data array is or can be used in a first operation such as a stencil operation. In other words, the stencil definition can be used to define a neighborhood on or with which stencil operations can be performed.

At block 1502, the first method 1500 can include determining a characteristic of the first stencil. For example, block 1502 can include determining a stencil height and a stencil width of the first stencil from the first stencil definition. The stencil height can correspond to a particular number of rows (e.g., N rows) in a memory array. The stencil width can correspond to a particular number of columns (e.g., M columns) in the memory array. In an example, the first stencil defines data for a compute operation or portion of a compute thread that can be performed using a tile-based functional unit, and the memory array comprises a tile-external memory or main memory in the CNM system 102 or in the HTF 142 of the CNM system 102.

At block 1504, the first method 1500 can include providing memory buffers in a tile memory. The memory buffers can be configured to temporarily store information for use in one or multiple operations defined by a stencil. In an example, the memory buffers can comprise a portion of a tile memory, such as in MEM_0 or MEM_1 in the example tile 504 of the HTF 500 from FIG. 5. The memory buffers can include multiple first-in-first-out (FIFO) buffers configured to receive data from a system or main memory and retain the data until after it is used in one or more stencil operations.

In an example, block 1504 can include providing N different FIFO buffers in or using the tile memory. That is, block 1504 can include establishing a number of different FIFO buffers that corresponds to the number of rows in a memory array that is referenced by, e.g., the first stencil. At block 1504, the first method 1500 can include providing the N different FIFO buffers with at least M different addressable elements. In other words, block 1504 can include establishing a size of each of the FIFO buffers in correspondence with the number of columns in the memory array that is reference by, e.g., the first stencil.

In the example of the second stencil 1102 from FIG. 11, the second stencil 1102 can have a height of N=3 rows and a width of M=3 columns. According to the example of FIG. 15 and using the second stencil 1102 as an example, block 1504 can include providing three different FIFO buffers with three different addressable elements in each buffer. Such a buffer configuration is illustrated graphically in the example of FIG. 13 as including buffers FIFO 0, FIFO 1, and FIFO 2, and each of the buffers has at least three different buffer locations or addressable elements.

Following block 1504, the first method 1500 can continue at block 1506 with populating the buffers provided at block 1504. In an example, block 1506 can include retrieving or receiving data from a system or main memory and writing, or pushing, the data into respective locations in the buffers. When M elements of the N buffers are full, then the buffers are considered to be occupied or to have a particular occupancy. For example, block 1506 can include populating a first of the N buffers with data corresponding to, e.g., a first row and the first M columns of data from the main memory (e.g., corresponding to columns 0 through M-1 of row 0 of the main memory). Populating the first of the N buffers can include consecutively reading respective data from the first M columns and then populating the corresponding first buffer such that the order of the data is preserved between the main memory and the buffer. Next, block 1506 can include populating a second of the N buffers with data corresponding to, e.g., a second row and the same first M columns of data from the main memory. Populating the buffers can again include consecutively reading and writing data to ensure the order of the data in the buffers matches the order of the data in the main memory. In the example, block 1506 can iteratively populate the buffers until the buffers have a first occupancy that includes NxM elements available for one or more operations. At block 1508, the first method 1500 can include performing a stencil operation using information from the first occupancy of the buffers.

Following the stencil operation using the first occupancy, the first method 1500 can continue at block 1510 with replacing some, but not necessarily all, of the information in the N FIFO buffers. For example, block 1510 can include popping a head position of each of the N FIFO buffers to purge or remove data from one location in each buffer. The removed data can correspond to, e.g., the data that was first-in-time to populate each buffer.

Following block 1510, the first method 1500 can continue at block 1512 with populating one location in each buffer with other information from the main memory. For example, block 1512 can include reading information from column M of the main memory and from the same first N rows as in block 1506. When the data from column M is present in the N FIFO buffers, then the buffers can have a second occupancy. That is, at block 1512, the buffers can have a second occupancy that corresponds to information from columns 1 through M of the main memory, whereas at block 1506, the buffers had a first occupancy that corresponds to information from columns 0 through M-1 of the main memory. At block 1514, the first method 1500 can include performing the stencil operation using information from the second occupancy of the buffers.

In an example, the first method 1500 can iteratively pop data from, and read new information to, each of the N buffers as the stencil progresses through the input data array. When a width of the array is traversed, then the N buffers can be fully purged and populated using data from different or subsequent rows along a height of the array. For example, a first iteration of block 1506 through block 1514 can include reading information from rows 0 through N-1, and from W columns of the main memory, into the buffers and performing one or more stencil operations for each different occupancy of the buffers (e.g., where W is a number of columns in the main memory and W is greater than M, the width of the stencil). Following a purge of the information in the buffers, a second iteration of block 1506 through block 1514 can include reading information from rows 1 through N and from the same W columns of the main memory, and performing the same one or more stencil operations for each different occupancy of the buffers. The iterations can continue according to the dimensions of the stencil and size of the input data array until the entire input data array is traversed or until another exit condition is satisfied.

Although the examples discussed herein generally refer to an ordered traversal of the input data array in horizontal (left to right) and then vertical (bottom to top) directions, different traversal patterns or directions can similarly be used. Further, the example of FIG. 15 refers to a single stencil, however, multiple stencils and stencil operations can optionally be performed for each occupancy of the buffers. Performing multiple stencils using the same buffer occupancy can help improve system efficiency, reduce latency and power consumption, and improve overall performance.

Figure 16:
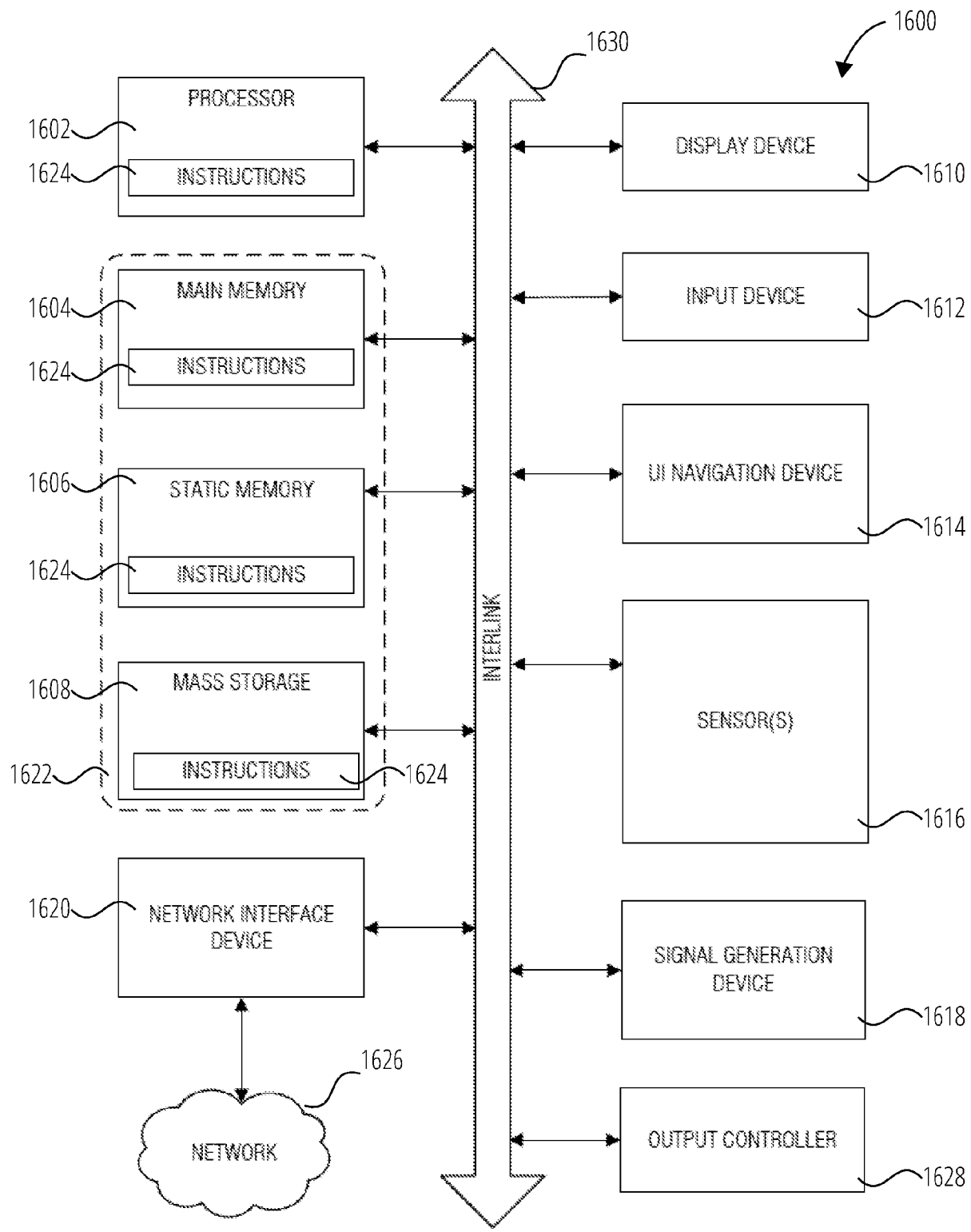
FIG. 16 illustrates a block diagram of an example machine with which, in which, or by which any one or more of the techniques (e.g., methodologies) discussed herein can be implemented.

FIG. 16 illustrates a block diagram of an example machine 1600 with which, in which, or by which any one or more of the techniques (e.g., methodologies) discussed herein can be implemented. Examples, as described herein, can include, or can operate by, logic or a number of components, or mechanisms in the machine 1600. Circuitry (e.g., processing circuitry) is a collection of circuits implemented in tangible entities of the machine 1600 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 1600.

In alternative embodiments, the machine 1600 can operate as a standalone device or can be connected (e.g., networked) to other machines. In a networked deployment, the machine 1600 can operate in the capacity of a server machine, a client machine, or both in server-client network environments. In an example, the machine 1600 can act as a peer machine in peer-to-peer (P2P) (or other distributed) network environment. The machine 1600 can be a personal computer (PC), a tablet PC, a set-top box (STB), a personal digital assistant (PDA), a mobile telephone, a web appliance, a network router, switch or bridge, or any machine capable of executing instructions (sequential or otherwise)

that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine 1600 (e.g., computer system) can include a hardware processor 1602 (e.g., a central processing unit (CPU), a graphics processing unit (GPU), a hardware processor core, or any combination thereof), a main memory 1604, a static memory 1606 (e.g., memory or storage for firmware, microcode, a basic-input-output (BIOS), unified extensible firmware interface (UEFI), etc.), and mass storage device 1608 (e.g., hard drives, tape drives, flash storage, or other block devices) some or all of which can communicate with each other via an interlink 1630 (e.g., bus). The machine 1600 can further include a display device 1610, an alphanumeric input device 1612 (e.g., a keyboard), and a user interface (UI) Navigation device 1614 (e.g., a mouse). In an example, the display device 1610, the input device 1612, and the UI navigation device 1614 can be a touch screen display. The machine 1600 can additionally include a mass storage device 1608 (e.g., a drive unit), a signal generation device 1618 (e.g., a speaker), a network interface device 1620, and one or more sensor(s) 1616, such as a global positioning system (GPS) sensor, compass, accelerometer, or other sensor. The machine 1600 can include an output controller 1628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the hardware processor 1602, the main memory 1604, the static memory 1606, or the mass storage device 1608 can be, or include, a machine-readable media 1622 on which is stored one or more sets of data structures or instructions 1624 (e.g., software) embodying or used by any one or more of the techniques or functions described herein. The instructions 1624 can also reside, completely or at least partially, within any of registers of the hardware processor 1602, the main memory 1604, the static memory 1606, or the mass storage device 1608 during execution thereof by the machine 1600. In an example, one or any combination of the hardware processor 1602, the main memory 1604, the static memory 1606, or the mass storage device 1608 can constitute the machine-readable media 1622. While the machine-readable media 1622 is illustrated as a single medium, the term "machine-readable medium" can include a single medium or multiple media (e.g., a centralized or distributed database, or associated caches and servers) configured to store the one or more instructions 1624.

The term "machine readable medium" can include any medium that is capable of storing, encoding, or carrying instructions for execution by the machine 1600 and that cause the machine 1600 to perform any one or more of the techniques of the present disclosure, or that is capable of storing, encoding or carrying data structures used by or associated with such instructions. Non-limiting machine-readable medium examples can include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magnetooptical disks; and CD-ROM and DVD-ROM disks.

In an example, information stored or otherwise provided on the machine-readable media 1622 can be representative of the instructions 1624, such as instructions 1624 themselves or a format from which the instructions 1624 can be derived. This format from which the instructions 1624 can be derived can include source code, encoded instructions (e.g., in compressed or encrypted form), packaged instructions (e.g., split into multiple packages), or the like. The information representative of the instructions 1624 in the machine-readable media 1622 can be processed by processing circuitry into the instructions to implement any of the operations discussed herein. For example, deriving the instructions 1624 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1624.

In an example, the derivation of the instructions 1624 can include assembly, compilation, or interpretation of the information (e.g., by the processing circuitry) to create the instructions 1624 from some intermediate or preprocessed format provided by the machine-readable media 1622. The information, when provided in multiple parts, can be combined, unpacked, and modified to create the instructions 1624. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1624 can be further transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1620 can include one or more physical jacks (e.g., Ethernet, coaxial, or phone jacks) or one or more antennas to connect to the network 1626. In an example, the network interface device 1620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1600, and includes digital or analog communications signals or other intangible medium to facilitate communication of such software. A transmission medium is a machine readable medium.

To better illustrate the methods and apparatuses described herein, a non-limiting set of Example embodiments are set forth below as numerically identified Examples.

Example 1 can include a method comprising receiving a first stencil definition for input data for a first operation (e.g., a stencil operation), and determining a stencil height and a stencil width from the first stencil definition. The stencil height can correspond to N rows in a memory element array and the stencil width can correspond to M columns in the memory element array. In Example 1, the method can further include providing N buffers in a tile memory of a first memory-compute tile, and each of the N buffers can include at least M different buffer elements. In an example, the first memory-compute tile comprises one of multiple tiles coupled by a synchronous compute fabric in a node of a memory-compute system. The method of Example 1 can further include reading first values from an external memory according to the first stencil definition and writing (sometimes referred to herein as "pushing") the first values into respective positions of the N buffers in the tile memory to provide a first occupancy of the buffers, and performing the first operation using information from the first occupancy of the buffers.

In Example 2, the subject matter of Example 1 optionally includes providing the N buffers as first-in-first-out (FIFO) buffers, and each of the FIFO buffers can include at least M different buffer elements.

In Example 3, the subject matter of Example 2 optionally includes reading, for the first values and for each of the first N columns in the tile memory, reading M values and writing or pushing the read M values into respective positions of the FIFO buffers.

In Example 4, the subject matter of any one or more of Examples 2-3 optionally includes performing the first operation using information corresponding to the first occupancy of the FIFO buffers and using fewer than all of the buffer elements.

In Example 5, the subject matter of any one or more of Examples 2-4 optionally includes popping a head position of each of the N FIFO buffers, reading second values from the external memory according to the first stencil definition, and writing or pushing the second values into respective positions of the FIFO buffers in the tile memory of the first memory-compute tile to provide a second occupancy of the FIFO buffers. Example 5 can further include performing the first operation using information from the second occupancy of the FIFO buffers.

In Example 6, the subject matter of Example 5 optionally includes reading the second values from the external memory including reading N values from only one column of the external memory.

In Example 7, the subject matter of any one or more of Examples 5-6 optionally includes reading the first values from the external memory including reading information from columns 0 through M-1 of the external memory, and reading the second values from the external memory can include reading information from column M of the external memory.

In Example 8, the subject matter of Example 7 optionally includes reading the information from columns 0 through M-1 of the external memory including reading information corresponding to rows 0 through N-1 of the external memory, and reading the information from column M of the external memory can include reading information corresponding to rows 0 through N-1 of the external memory.

In Example 9, the subject matter of any one or more of Examples 2-8 optionally includes receiving a second stencil definition for input data for a second operation (e.g., a stencil operation), and the first and second stencil definitions can refer to different or partially overlapping input data in the external memory. Example 9 can optionally further include performing the second operation using information from the first occupancy of the buffers. In Example 9, the second stencil does not require different FIFO buffer information than is used by the first stencil, but allows for the possibility that the second stencil uses different FIFO buffer information.

In Example 10, the subject matter of Example 9 optionally includes the stencil height as-determined from the first stencil definition being greater than a stencil height from the second stencil definition, and the stencil width as-determined from the first stencil definition can be greater than a stencil width from the second stencil definition.

In Example 11, the subject matter of any one or more of Examples 2-10 optionally includes, for each of multiple iterations, (a) popping a head position of the each of the FIFO buffers, (b) reading other values from the external memory according to the first stencil definition, and (c) pushing the read values into respective positions of the FIFO buffers to provide respective different occupancies of the FIFO buffers. Example 11 can optionally include performing the first operation using information corresponding to each of the different occupancies of the FIFO buffers.

In Example 12, the subject matter of Example 11 optionally includes reading the first values from the external memory including anchoring a first stencil at a corner location of a grid that represents H rows and W columns of the external memory, and the method can further include, after performing the first operation using information corresponding to each of the different occupancies of the FIFO buffers: purging the FIFO buffers, anchoring the first stencil adjacent to the corner location of the grid in the height direction, and for each of W-M+1 columns, (a) reading values from the external memory according to the first stencil definition, (b) pushing the read values into respective positions of the FIFO buffers, (c) performing the first operation using information from a present occupancy of the FIFO buffer, and (d) popping a head position of each of the FIFO buffers before reading subsequent values from the external memory.

Example 13 can include or use an apparatus comprising a first memory-compute tile of multiple memory-compute tiles in a node of a compute-near-memory system, and the first memory-compute tile includes a first tile memory and a processor configured to perform operations comprising receiving a first stencil that defines input data for a first operation, determining a stencil height and a stencil width from the first stencil, the stencil height corresponding to N rows in a tile-external memory and the stencil width corresponding to M columns in the tile-external memory, and establishing N buffers in the first tile memory. In Example 13, each of the N buffers includes M buffer elements, and Example 13 can include populating the M buffer elements of the N buffers using respective information, defined by the first stencil, from the tile-external memory.

In Example 14, the subject matter of Example 13 optionally includes the processor further configured to perform operations comprising establishing the N buffers as an M-block first-in-first-out (FIFO) buffer in the first tile memory.

In Example 15, the subject matter of Example 14 optionally includes the processor further configured to perform operations comprising anchoring the first stencil in a first location with respect to an array of elements in the tile-external memory, reading first values from the tile-external memory according to the first stencil, and pushing the first values into respective portions of the N buffers to provide a first occupancy of the buffers. Example 15 can further include the processor performing the first operation using information from the first occupancy of the buffers, popping a head position of each of the buffers, anchoring the first stencil in a second location with respect to the array of elements in the tile-external memory, wherein the second location is adjacent to the first location, reading second values from the tile-external memory according to the first stencil, and pushing the second values into respective portions of the N buffers to provide a second occupancy of the buffers. Example 15 can further include performing the first operation (e.g., using the processor or other compute element) using information from the second occupancy of the buffers.

In Example 16, the subject matter of any one or more of Examples 13-15 optionally includes the processor further configured to perform the first operation using fewer than all of the M buffer elements from the N buffers, and configured to provide a result array in a second tile memory.

In Example 17, the subject matter of any one or more of Examples 13-16 optionally includes the tile-external memory having multiple separately addressable memory locations provided as a grid of H rows and W columns, wherein H is greater than or equal to N, and wherein W is greater than or equal to M.

Example 18 can include a memory-compute system comprising multiple memory-compute nodes coupled by a scale fabric to provide a compute fabric, wherein each of the nodes comprises a hybrid threading processor and a hybrid threading fabric, and wherein a first node of the multiple memory-compute nodes comprises a main memory and a processor. In Example 18, the processor can be configured to perform operations comprising receiving a first stencil that defines input data for a first operation (e.g., a stencil operation), determining a stencil height and a stencil width from the first stencil, the stencil height corresponding to N rows in the main memory and the stencil width corresponding to M columns in the main memory, establishing N buffers, wherein each of the N buffers includes M buffer elements, and populating the M buffer elements of the N buffers using respective information, defined by the first stencil, from the main memory.

In Example 19, the subject matter of Example 18 optionally includes the processor further configured to perform operations comprising establishing the N buffers as respective different FIFO buffers, popping a head element of each of the FIFO buffers, populating one new element in each of the FIFO buffers using information, defined by the first stencil at a second location of the main memory, to provide a second buffer occupancy, and optionally performing the operation using information from the FIFO buffers corresponding to the second buffer occupancy.

In Example 20, the subject matter of any one or more of Examples 18-19 optionally includes performing the first operation using less than all of the information from the FIFO buffers corresponding to the first buffer occupancy.

Each of these non-limiting Examples can stand on its own or can be combined in various permutations or combinations with one or more of the other Examples discussed herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
receiving a first stencil definition for input data for a first operation;
determining a stencil height and a stencil width from the first stencil definition, the stencil height corresponding to N rows in a memory element array and the stencil width corresponding to M columns in the memory element array;
providing N buffers in a tile memory of a first memory-compute tile, wherein each of the N buffers includes at least M different buffer elements, and wherein the first memory-compute tile comprises one of multiple tiles coupled by a synchronous compute fabric in a node of a memory-compute system;

reading first values from an external memory according to the first stencil definition and writing the first values to respective positions of the N buffers in the tile memory to provide a first occupancy of the buffers; and performing the first operation using information from the first occupancy of the buffers.

2. The method of claim 1, wherein providing the N buffers includes providing N different first-in-first-out (FIFO) buffers, and wherein each of the FIFO buffers includes at least M different buffer elements.

3. The method of claim 2, wherein reading the first values includes, for each of the first N columns in the tile memory, reading M values and writing the read M values into respective positions of the FIFO buffers.

4. The method of claim 2, wherein performing the first operation includes using information corresponding to the first occupancy of the FIFO buffers and using fewer than all of the buffer elements.

5. The method of claim 2, further comprising:
popping a head position of each of the N FIFO buffers;
reading second values from the external memory according to the first stencil definition and writing the second values into respective positions of the FIFO buffers in the tile memory of the first memory-compute tile to provide a second occupancy of the FIFO buffers; and
performing the first operation using information from the second occupancy of the FIFO buffers.

6. The method of claim 5, wherein reading the second values from the external memory includes reading N values from only one column of the external memory.

7. The method of claim 5, wherein reading the first values from the external memory includes reading information from columns 0 through M-1 of the external memory; and
wherein reading the second values from the external memory includes reading information from column M of the external memory.

8. The method of claim 7, wherein reading the information from columns 0 through M-1 of the external memory includes reading information corresponding to rows 0 through N-1 of the external memory; and
wherein reading the information from column M of the external memory includes reading information corresponding to rows 0 through N-1 of the external memory.

9. The method of claim 2, further comprising:
receiving a second stencil definition for input data for a second operation, wherein the first and second stencil definitions refer to different or partially overlapping input data in the external memory; and
performing the second operation using information from the first occupancy of the buffers.

10. The method of claim 9, wherein the stencil height as-determined from the first stencil definition is greater than a stencil height from the second stencil definition, and wherein the stencil width as-determined from the first stencil definition is greater than a stencil width from the second stencil definition.

11. The method of claim 2, further comprising:
for each of multiple iterations, (a) popping a head position of the each of the FIFO buffers, (b) reading other values from the external memory according to the first stencil definition, and (c) writing the read values into respective positions of the FIFO buffers to provide respective different occupancies of the FIFO buffers; and performing the first operation using information corresponding to each of the different occupancies of the FIFO buffers.

12. The method of claim 11, wherein reading the first values from the external memory includes anchoring a first stencil at a corner location of a grid that represents H rows and W columns of the external memory; and
the method further comprising, after performing the first operation using information corresponding to each of the different occupancies of the FIFO buffers:
purging the FIFO buffers;
anchoring the first stencil adjacent to the corner location of the grid in the height direction; and
for each of W-M+1 columns, (a) reading values from the external memory according to the first stencil definition, (b) writing the read values into respective positions of the FIFO buffers, (c) performing the first operation using information from a present occupancy of the FIFO buffer, and (d) popping a head position of each of the FIFO buffers before reading subsequent values from the external memory.

13. An apparatus comprising:
a first memory-compute tile of multiple memory-compute tiles in a node of a compute-near-memory system, wherein the first memory-compute tile includes:
a first tile memory; and
a processor configured to perform operations comprising:
receiving a first stencil that defines input data for a first operation;
determining a stencil height and a stencil width from the first stencil, the stencil height corresponding to N rows in a tile-external memory and the stencil width corresponding to M columns in the tile-external memory;
establishing N buffers in the first tile memory, wherein each of the N buffers includes M buffer elements; and
populating the M buffer elements of the N buffers using respective information, defined by the first stencil, from the tile-external memory.

14. The apparatus of claim 13, wherein the processor is further configured to perform operations comprising establishing the N buffers as an M-block first-in-first-out (FIFO) buffer in the first tile memory.

15. The apparatus of claim 14, wherein the processor is further configured to perform operations comprising:
anchoring the first stencil in a first location with respect to an array of elements in the tile-external memory, reading first values from the tile-external memory according to the first stencil, and writing the first values into respective portions of the N buffers to provide a first occupancy of the buffers;
performing the first operation using information from the first occupancy of the buffers;
popping a head position of each of the buffers;
anchoring the first stencil in a second location with respect to the array of elements in the tile-external memory, wherein the second location is adjacent to the first location, reading second values from the tile-external memory according to the first stencil, and writing the second values into respective portions of the N buffers to provide a second occupancy of the buffers; and
performing the first operation using information from the second occupancy of the buffers.

16. The apparatus of claim 13, wherein the processor is further configured to perform the first operation using fewer than all of the M buffer elements from the N buffers, and provide a result array in a second tile memory.

17. The apparatus of claim 13, wherein the tile-external memory comprises multiple separately addressable memory locations provided as a grid of H rows and W columns, wherein H is greater than or equal to N, and wherein W is greater than or equal to M.

18. A memory-compute system comprising:
multiple memory-compute nodes coupled by a scale fabric to provide a compute fabric, wherein each of the nodes comprises a hybrid threading processor and a hybrid threading fabric, wherein a first node of the multiple memory-compute nodes comprises a main memory and a processor configured to perform operations comprising:
  receiving a first stencil that defines input data for a first stencil operation;
  determining a stencil height and a stencil width from the first stencil, the stencil height corresponding to N rows in the main memory and the stencil width corresponding to M columns in the main memory;
  establishing N buffers, wherein each of the N buffers includes M buffer elements; and
  populating the M buffer elements of the N buffers using respective information, defined by the first stencil, from the main memory.

19. The memory-compute system of claim 18, wherein the processor is further configured to perform operations comprising:
  establishing the N buffers as respective different FIFO buffers;
  popping a head element of each of the FIFO buffers;
  populating one new element in each of the FIFO buffers using information, defined by the first stencil at a second location of the main memory, to provide a second buffer occupancy; and
  performing the first stencil operation using information from the FIFO buffers corresponding to the second buffer occupancy.

20. The memory-compute system of claim 18, wherein performing the first stencil operation includes using less than all of the information from the FIFO buffers corresponding to the first buffer occupancy.

* * * * *